US006327694B1

(12) United States Patent
Kanazawa

(10) Patent No.: US 6,327,694 B1
(45) Date of Patent: Dec. 4, 2001

(54) CELL PLACEMENT APPARATUS AND METHOD, AND COMPUTER READABLE RECORD MEDIUM HAVING CELL PLACEMENT PROGRAM RECORDED THEREON

(75) Inventor: Yuzi Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/176,260

(22) Filed: Oct. 20, 1998

(30) Foreign Application Priority Data

May 22, 1998 (JP) .................................................. 10-140921

(51) Int. Cl.[7] ...................................................... G06F 17/50
(52) U.S. Cl. .................................................................. 716/7
(58) Field of Search .................................... 716/8, 7, 9, 11

(56) References Cited

U.S. PATENT DOCUMENTS 6,067,409 * 5/2000 Scepanovic ................................ 716/8

FOREIGN PATENT DOCUMENTS

| 63-260150 | 10/1988 | (JP) . |
| 4-160570 | 6/1992 | (JP) . |
| 5-190813 | 7/1993 | (JP) . |
| 6-180733 | 6/1994 | (JP) . |

OTHER PUBLICATIONS

N. Sherwani, "Algorithms for VLSI Physical Design Automation", pp. 15, 4–158, 191–193, and 223–224, (1995).

* cited by examiner

Primary Examiner—Matthew Smith
Assistant Examiner—Thuan Do
(74) Attorney, Agent, or Firm—Staas & Halsey, LLP

(57) ABSTRACT

A restricted region managing module accepts for management a restricted region and its cell maximum activity ratio ρmax specified by a restricted region specifying module. A cell placing module places cells in such a manner that a cell activity ratio ρ of the restricted region managed by the restricted region managing module does not exceed the specified cell maximum activity ratio ρmax.

24 Claims, 19 Drawing Sheets

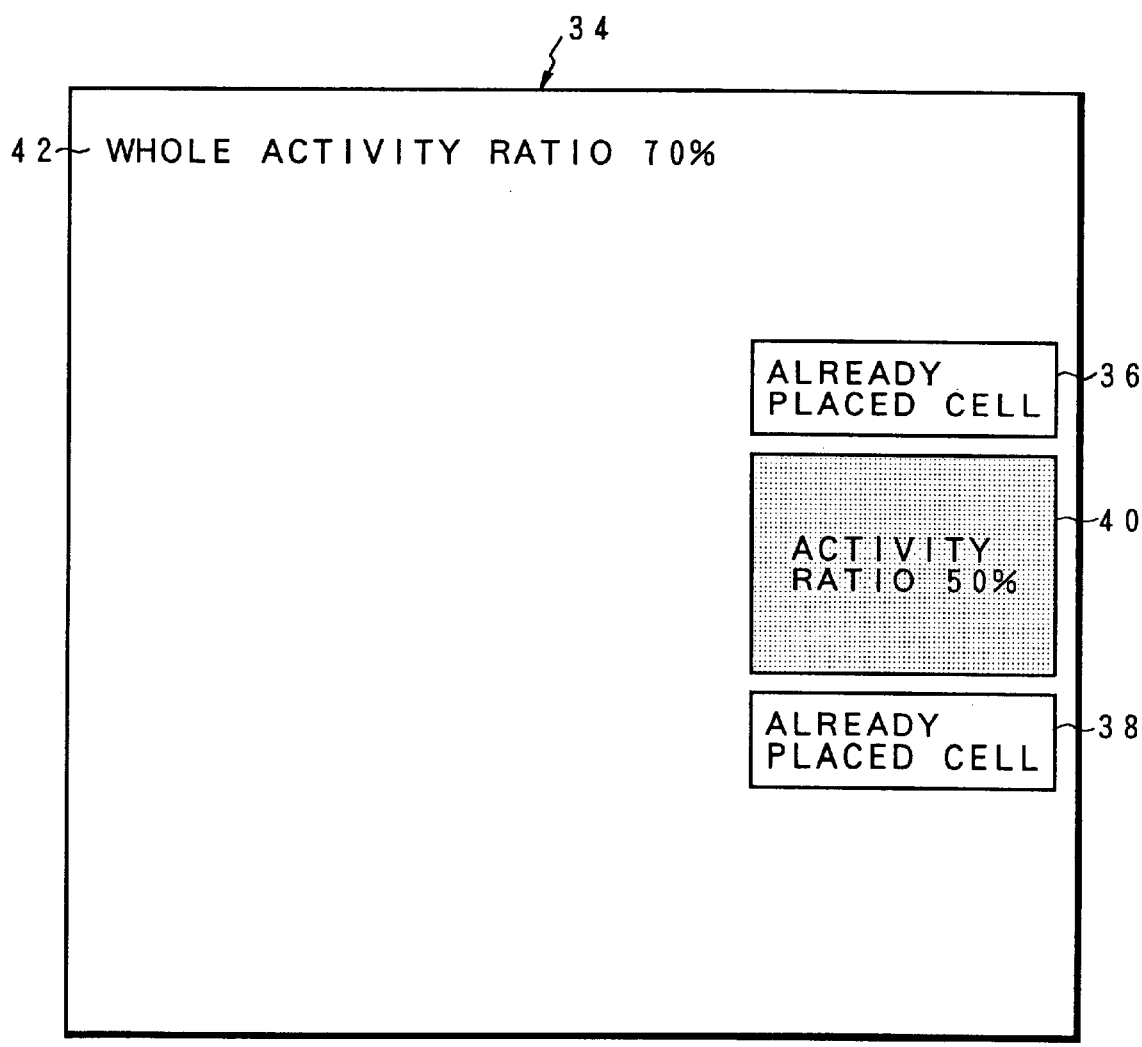

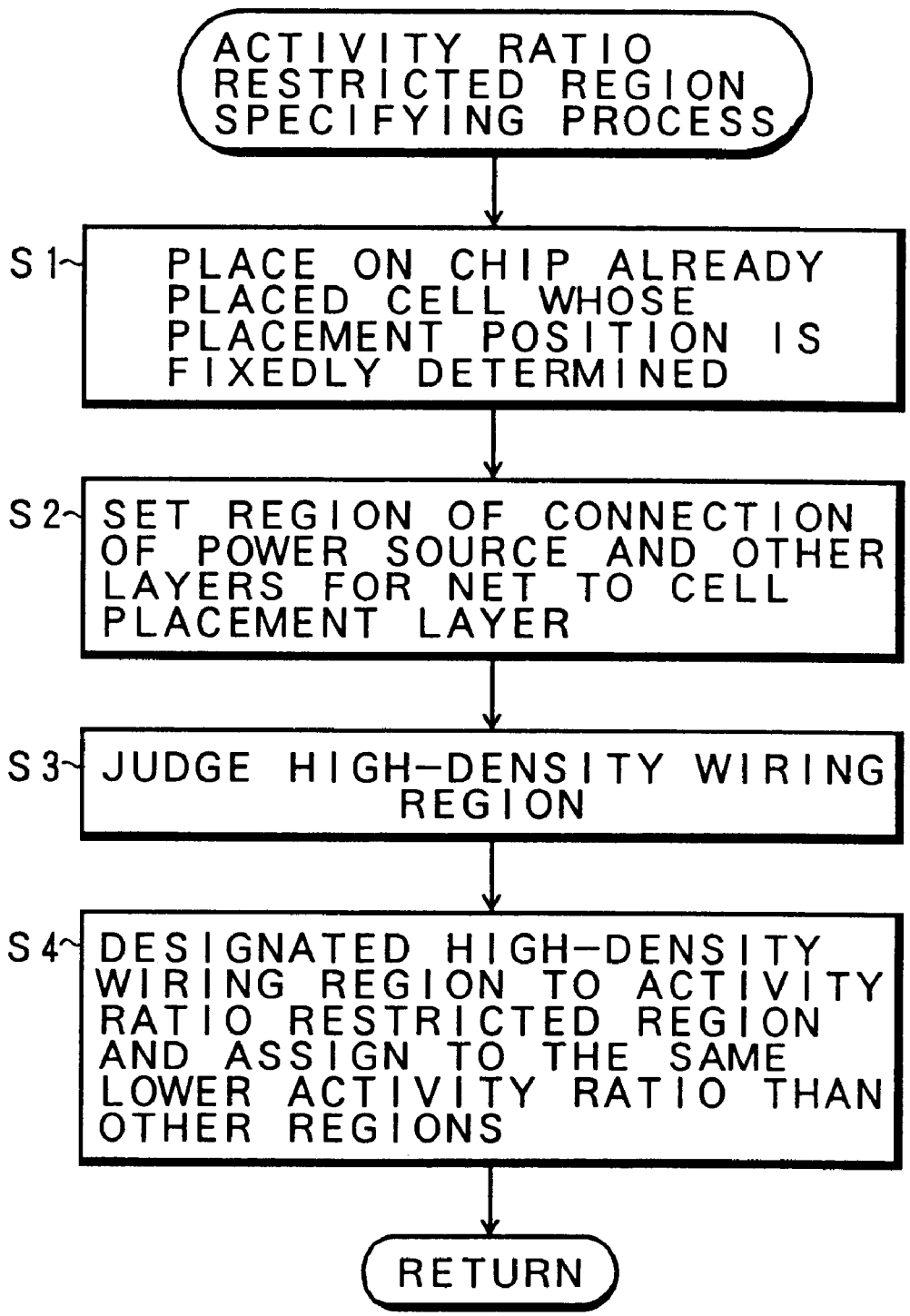

FIG. 7A
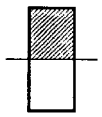
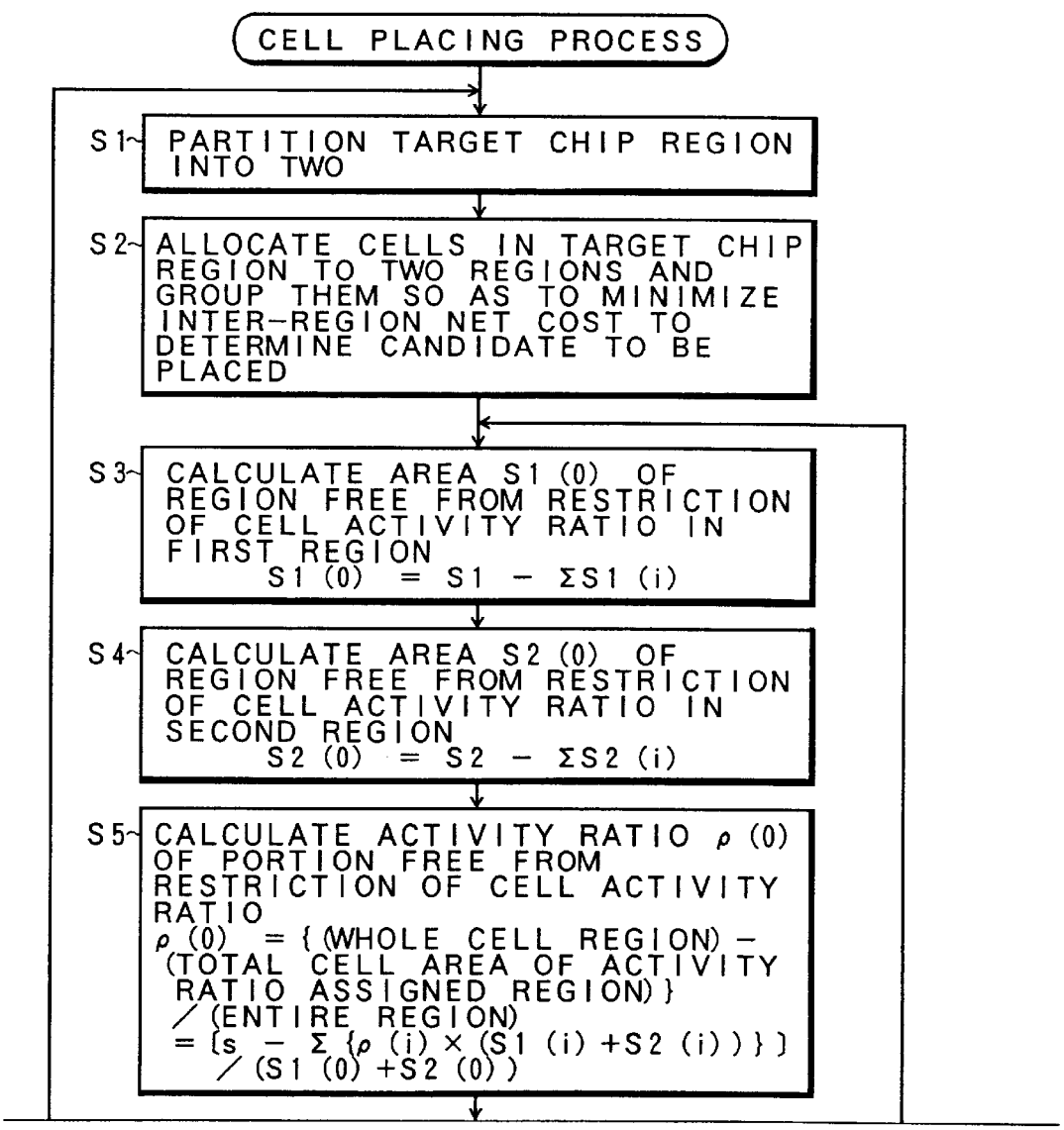

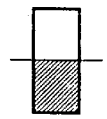
FIG. 7B
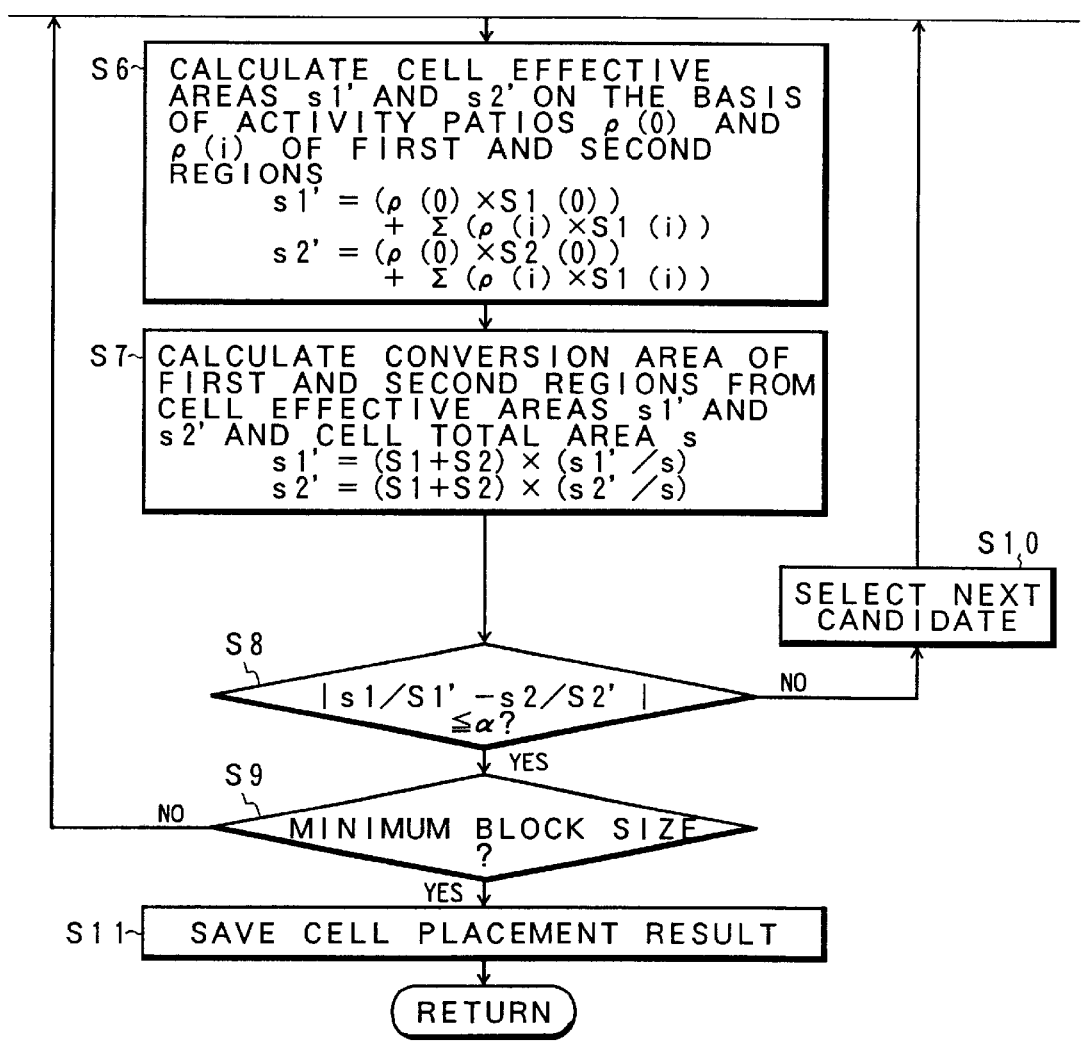

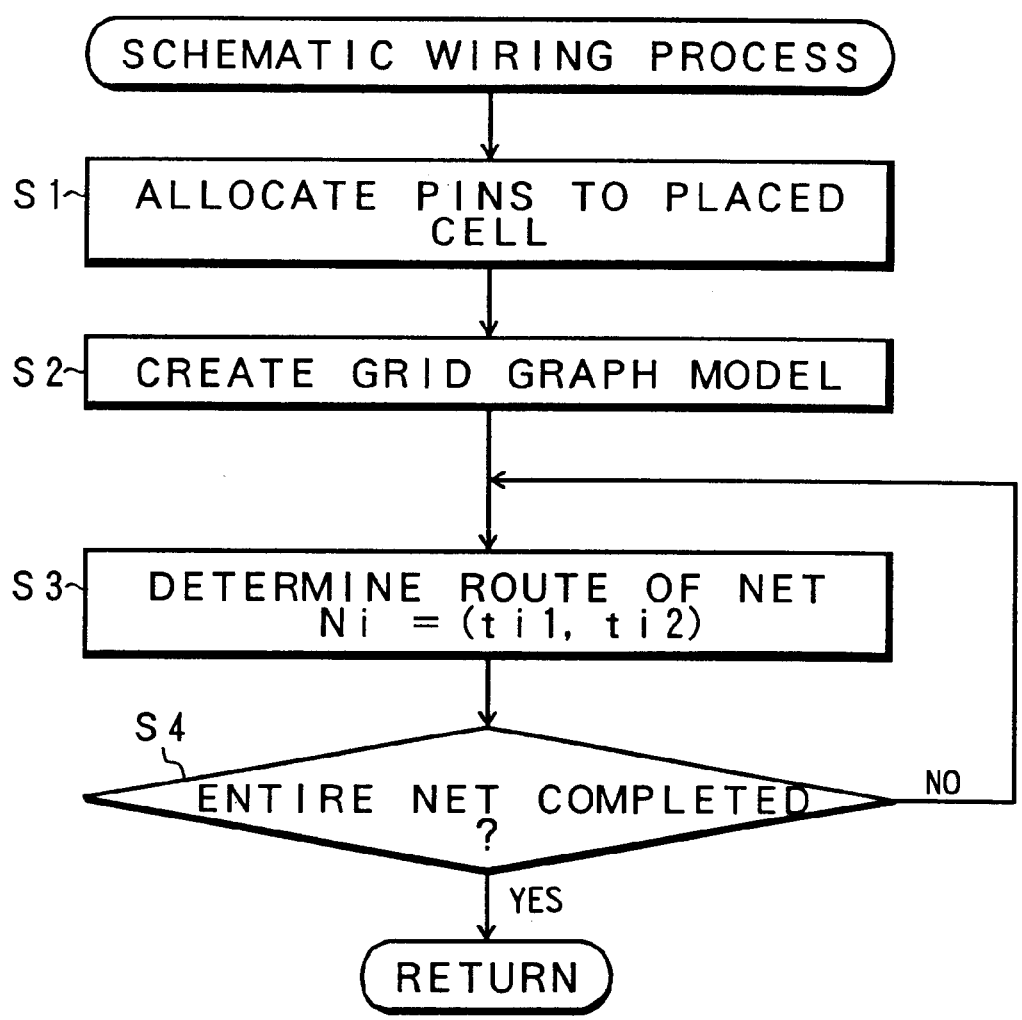

CELL PLACEMENT APPARATUS AND METHOD, AND COMPUTER READABLE RECORD MEDIUM HAVING CELL PLACEMENT PROGRAM RECORDED THEREON

BACKGROUND OF THE INVENTION

1. Field of the Invention

The present invention relates generally to a cell placement apparatus and method for use in a layout design following a logic design in a computer aided design automation of LSIs or VLSIs and to a computer readable record medium having a cell placement program stored thereon. More particularly, it is directed to a cell placement apparatus and method for realizing an optimum cell placement with a restricted cell activity ratio of a high-density wiring region on a cell, as well as to a computer readable record medium on which a cell placement program is stored.

2. Description of the Related Arts

In a CAD system for automatically designing large-scale semiconductor integrated circuits such as VLSIs or LSIs with the aid of a computer, a logic design is first carried out for determining AND, OR or other cells and cell-to-cell connections (nets). Cell placement processing is then performed for determining locations of cells on a chip on the basis of a netlist acquired from the logic design. Wiring processing (routing) is finally effected for determining the wiring, that is, how to provide nets between the cells placed on the chip.

Known as the cell placement processing is for example a partitioning based placement algorithm. In the partitioning based placement algorithm, the entire chip is first partitioned into two regions so that all the cells are assigned to the two regions obtained as a result of the partitioning. A criterion for the cell assignment is a cost which is the number of nets connecting the two regions when the cells are assigned to the two regions. The grouping is so made as to minimize the cost. Such cell region partitioning and cell assignment are iterated until the partitioned blocks result in minimum blocks each corresponding to a single cell. In this case, if the cells become dense at one place as a result of the cell placement on the chip, it may be impossible to effect the wiring. Hence, the placement is carried out with a restriction condition of the cell distribution. In order to establish the restriction condition, cell activity ratios $\rho(1)$ and $\rho(2)$ of the two regions are first figured out from $\rho(2)=s1/S1$ $\rho(2)=s2/S2$ The cells are then grouped so as to meet a restriction condition given as a conditional expression that an absolute value of a difference between the activity ratios of the two regions should be equal to or less than a positive constant $\alpha$, that is, a restriction condition given as $$|(s1/S1)-(s2/S2)| \leq \alpha \qquad (1)$$

where $\alpha$ is a positive constant.

An appropriate dispersion of the cells are thus achieved by placing the cells so as to fulfill the condition that the difference between the cell activity ratios upon the block partitioning lies within a certain range. Such a restriction condition for the cell activity ratios is called an area restriction.

In typical computer aided cell placement processing, however, all the cells are not newly placed on the chip. For example, clock signal sending cells, RAMs or other cells are already located previous to the automatic cell placement. For this reason, conventional cell placement processing having the area restriction defined as a cell placement restriction condition may suffer from an inconvenience that uneven wiring density may occur in the wiring processing which is carried out after the completion of the cell placement, if there exist already placed cells of which placement locations have been previously determined on the chip, due to nets connecting to the already placed cells. As a result of this, a portion having a higher wiring density must be given a lower cell activity ratio than the other portions upon the cell placement since it requires a larger area for the wiring than the areas required by the other portions. The wiring density could be substantially accurately estimated by an execution of rough wiring. A method is thus conceivable in which the rough wiring is performed at the time of completion of the cell placement with the addition of an operation for removing some cells from a high-density wiring portion. However, in the event of removing the cells from the high-density wiring portion for relocation to the other portions, the cell activity ratio restriction condition for the cell placement processing may collapse, which may result in an overall degradation of the cell placement quality and unfeasible wiring. Another algorithm such as simulated annealing would also be available to perform the operation for removing some cells from a high-density wiring portion for the relocation to the other portions while assuring the cell placement quality. However, this method may need more processing time although the cell placement quality is assured.

An approach to a reduction of the cell activity area in a specific region is a use of a cell placement inhibition region or a floor plan. However, the cell placement inhibition region is provided to entirely inhibit the placement of cells in a region. Therefore, in the event that the cell placement inhibition region is partially provided in a region to reduce the cell activity area, this may possibly induce a more serious inconvenience that the presence of this cell placement inhibition region may impose a size limitation of cells which can be placed therein, impeding the placement of larger cells. The floor plan is used to specify a region in which is arranged a module (macro cell) making up a certain logic. In case of the floor plan, the logic determines a unit to be controlled. This may make it hard to reduce the cell activity area of a high-density wiring region existing in a module by use of the floor plan. It may also be unfeasible for the floor plan to reduce the cell activity area of a high-density wiring region which exists between two modules. That is, both the cell placement inhibition region and the floor plan were conceived for the other objects, with no intention to reduce the cell activity area of a high-density wiring region. Thus, there have arisen deficiencies that existence of already placed cells or other cells on the chip may make the wiring difficult due to the occurrence of high-density portions of both the nets and cells and that the reexecution of the cell placement to avoid this may result in extended processing time.

SUMMARY OF THE INVENTION

According to a first aspect of the present invention, there is provided a cell placement apparatus capable of preventing the wiring from becoming difficult due to an increased wiring density in a specific cell placement region attributable to the already placed cells, etc.

The cell placement apparatus of the present invention comprises a restricted region specifying module, a restricted region managing module and a cell placing module. The restricted region specifying module specifies both a restricted region in which is restricted a cell activity ratio indicative of a ratio of a cell occupied area to a chip surface area and a cell maximum activity ratio $\rho$, e.g., $\rho=50\%$, of the restricted region. The restricted region managing module accepts for management the restricted region and the cell maximum activity ratio specified by the restricted region specifying module. The cell placing module places cells in such a manner that the cell activity ratio of the restricted region managed by the restricted region managing module does not exceed the cell maximum activity ratio. In case of the cell placement apparatus of the present invention in this manner, a portion likely to have a higher wiring density on the chip is specified as a restricted region in which the cell activity ratio is restricted while simultaneously specifying the maximum cell activity ratio within the restricted region, whereby cells are arranged in such a manner that the cell activity ratio of the specified restricted region does not exceed the specified maximum cell activity ratio, so that a high wiring density region has a low cell activity ratio so as to ensure secure wiring and to allow a completion of the wiring without needing any excess time.

A simplest manner of deciding the location of the restricted region and the cell maximum activity ratio is a specification by a user. That is, the restricted region specifying module specifies the restricted region and the cell maximum activity ratio on the basis of an operative input of the user. In this case, the restricted region specifying module specifies as the cell maximum activity ratio of the restricted region a lower activity ratio than a cell activity ratio of the chip in its entirety. For example, the restricted region specifying module specifies a 50% of activity ratio as the cell maximum activity ratio of the restricted region, with respect to 60 to 70% of ordinary cell activity ratios.

Another approach to the decision of the location of the restricted region and the cell maximum activity ratio is to allow the restricted region specifying module to estimate a wiring density of portions obtained from on-chip block partitioning based on locations of already placed cells of which placement locations are fixedly determined and to determine from the wiring density a restricted region in which a cell activity ratio is restricted and a cell maximum activity ratio of the restricted region. To this end, the restricted region specifying module includes an already placed cell placing module for placing already placed cells of which placement locations are fixedly determined on the chip;

a rough wiring module for executing a rough wiring for the already placed cells; a high-density wiring region judging module which partitions the chip into blocks each having a predetermined size and detects a wiring density based on the rough wiring for each block, to judge whether a region is a high-density wiring region or not; and a restricted region deciding module which decides the high-density wiring region as a restricted region in which a cell activity ratio is restricted and allocates as a cell maximum activity ratio to the restricted region a lower activity ratio than an ordinary cell activity ratio.

A further approach to the decision of the location of the restricted region and the cell maximum activity ratio is to allow the restricted region specifying module to estimate a wiring density of portions obtained from on-chip block partitioning based on locations of globally placed cells and to determine from the wiring density a restricted region in which a cell activity ratio is restricted and a cell maximum activity ratio of the restricted region. To this end, the restricted region specifying module includes a cell global placing module for globally placing cells on the chip; a rough wiring module for performing a rough wiring for the globally placed cells; a high-density wiring region judging module which partitions the chip into blocks each having a predetermined size and detects a wiring density based on the rough wiring for each block, to judge whether it is a high-density wiring region or not; and a restricted region deciding module which decides the high-density wiring region as a restricted region in which a cell activity ratio is restricted and allocates to the restricted region as the cell maximum activity ratio a lower activity ratio than an ordinary cell activity ratio. In this case, the cell global placement allows a rapid cell placement but results in poor optimization, so that the execution of the wiring by use of this cell placement result increases the wiring length, making the wiring hard to impair the quality, which is unsuitable for use in the wiring processing. However, a high-density wiring region can be estimated to some degree, so that the high-density wiring region is judged from a rough wiring based on the cell global placement information, with the specification of a restricted region and a cell maximum activity ratio which is lower than the ordinary value, whereby there can be expected a cell placement result ensuring an easy wiring.

The restricted region deciding module decides as the cell maximum activity ratio of the restricted region a lower activity ratio than a cell activity ratio of the chip in its entirety. The restricted region deciding module has activity ratio information in which is previously registered a cell maximum activity ratio of the restricted region and refers to the activity ratio information to determine the cell maximum activity ratio of the restricted region. The cell placing module includes a partitioning based placing module which iterates sequential bisecting of a chip region to group cells so as to minimize a cost indicative of the number of nets between bisected regions for each partitioning; and a cell placement control module which proportionally divides a total area (S1+S2) of the bisected regions by a ratio, to a total cell area s of the bisected regions, of cell effective areas s1' and s2' of the bisected regions based on the cell maximum activity ratio of the restricted region, to convert the total area (S1+S2) into areas S1' and S2' of the bisected regions, and which provides a control of grouping of the cells effected by the partitioning based placing module so that a difference between ratios of the total cell areas of the bisected regions to converted the areas S1' and S2' of the bisected regions lies within a predetermined range. The cell placement control module executes the following processing.

I) To let s1 and s2 be cell areas in a first region and a second region, respectively, which are obtained as a result of bisecting, s (=s1+s2) be a total cell area, S1 and S2 be areas of the first region and the second region, respectively, S1(i) be an area of a portion belonging to the first region within an i-th restricted region, S2(i) be an area of a portion belonging to the second region within the i-th restricted region, and $\rho(i)$ be a cell activity ratio specified for the i-th restricted region;

II) To figure out areas S1(0) and S2(0) of portions having no cell activity ratio restriction in the first region and the second region, respectively, from $$S1(0)=S1-\Sigma S1(i)$$

$$S2(0)=S2-\Sigma S2(i)$$

III) To figure out an activity ratio $\rho(0)$ of a portion having no cell activity ratio restriction, from $$\rho(0)=\{(\text{total cell area})-(\text{total cell area of activity ratio specified regions})\}/(\text{total area})=[s-\Sigma\{\rho(i)\times(S1(i)+S2(i))\}]/S1(0)+S2(0)$$

IV) To figure out cell effective areas s1' and s2' in the first and second regions, respectively, based on the activity ratios $\rho(0)$ and $\rho(i)$, from $$s1'=\rho(0)\times S1(0)+\Sigma(\rho(i)\times S1(i))$$

$$s2'=\rho(0)\times S2(0)+\Sigma(\rho(i)\times S1(i))$$

V) To figure out converted areas S1' and S2' by proportionally dividing a total area of the first and second regions by ratios, to a total cell area s, of cell effective areas s1' and s2' in the first and second regions, respectively, using $$S1'=(S1+S2)\times(s1'/s)$$

$$S2'=(S1+S2)\times(s2'/s)$$

VI) To provide a control of grouping of cells effected by the partitioning based placing module so that an absolute value of a difference between ratios of cell areas s1 and s2 to the converted areas S1' and S2', respectively, of the first and second regions, respectively, satisfies a condition $$|s1/S1'-s2/S2'|\leq\alpha$$

According to a second aspect of the present invention, there is provided a cell placement method capable of preventing the wiring from becoming difficult due to a higher wiring density in a specific cell placement region attributable to the already placed cells, etc. The cell placement method comprises:

a restricted region specifying step for specifying a restricted region in which is restricted a cell activity ratio indicative of a ratio of a cell occupied area to the entire surface area of a chip and a cell maximum activity ratio of the restricted region;

a restricted region managing step for accepting for management the restricted region and the cell maximum activity ratio specified in the restricted region specifying step; and a cell placing step for placing cells in such a manner that the cell activity ratio of the restricted region managed in the restricted region managing step does not exceed the cell maximum activity ratio.

The details of the cell placement method are substantially the same as those of the apparatus configurations.

According to a third aspect of the present invention, there is provided a computer readable record medium on which is recorded a cell placement program which comprises:

a restricted region specifying module for specifying both a restricted region in which is restricted a cell activity ratio indicative of a ratio of a cell occupied area to a chip surface area and a cell maximum activity ratio of the restricted region;

a restricted region managing module for accepting for management the restricted region and the cell maximum activity ratio specified by the restricted region specifying module; and a cell placing module for placing cells in such a manner that the cell activity ratio of the restricted region managed by the restricted region managing module does not exceed the cell maximum activity ratio.

The details of the record medium having the cell placement program recorded thereon are also substantially the same as those of the apparatus configurations.

The above and other objects, aspects, features and advantages of the present invention will become more apparent from the following detailed description with reference to the accompanying drawings.

BRIEF DESCRIPTION OF THE DRAWINGS

FIG. 3 is an explanatory diagram of a user specification of a restricted region in case already placed cells lie on a chip;

FIG. 6 is a detailed flowchart of restricted region specification processing of FIG. 2 effected through the user specification;

FIGS. 7A and 7B are detailed flowcharts of the cell placement processing of FIG. 4 on the basis of the specification of a restricted region and a cell maximum activity ratio;

FIG. 14 is a detailed flowchart of rough wiring processing of FIG. 13 using a grid graph;

DETAILED DESCRIPTION OF THE PREFERRED EMBODIMENTS

Figure 1:
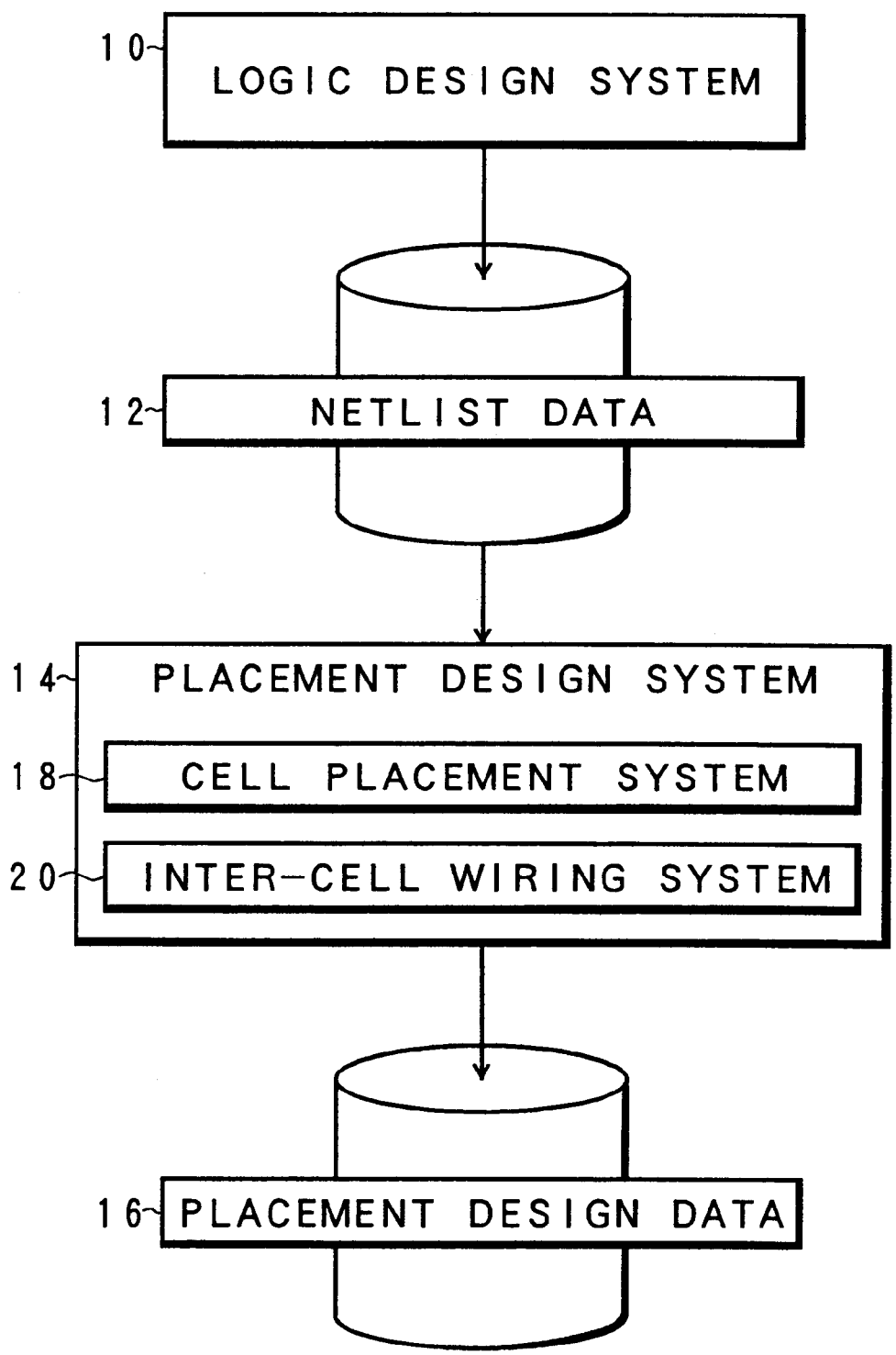
FIG. 1 is a block diagram of an LSI automatic design system in which a cell placement apparatus of the present invention is used.

FIG. 1 is a block diagram of a computer aided LSI or VLSI automatic design system using a cell placement apparatus in accordance with the present invention. The LSI automatic design system comprises a logic design system 10 and a layout design system 14. The logic design system 10 accepts information indicative of the content of action of a large-scale integrated circuit to be designed and creates netlist data 12 in the form of logical connection information represented as cell-to-cell connection information registered in a library. On the basis of the netlist data 12 created by the logic design system 10, the layout design system 14 performs an on-chip cell placement and placed cell-to-cell wiring processing to create layout design data 16. To this end, the layout design system 14 is provided with a cell placement system 18 and an inter-cell wiring system 20. The cell placement apparatus of the present invention is implemented as the cell placement system 18 provided in the layout design system 14.

Figure 2:
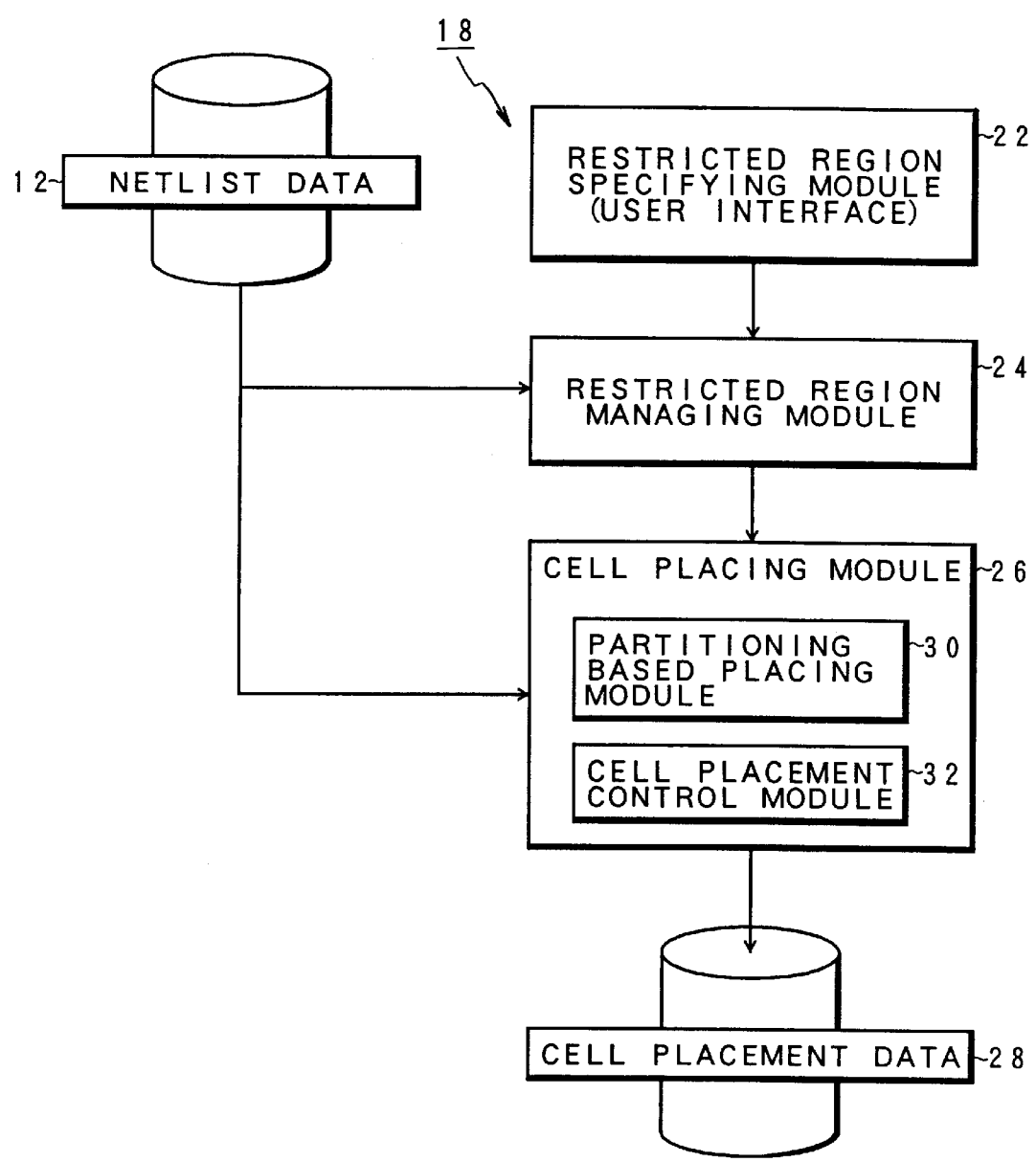
FIG. 2 is a function block diagram of a cell placement system of FIG. 1 implementing the cell placement apparatus of the present invention.

FIG. 2 illustrates a first embodiment of the cell placement apparatus of the present invention in the form of the cell placement system 18 provided in the layout design system 14 of FIG. 1. This embodiment is characterized in that the user specifies a restricted region in which an on-chip cell activity ratio is restricted and a cell maximum activity ratio of the restricted region. The cell placement system 18 acting as the cell placement apparatus of the present invention comprises a restricted region specifying module 22 acting as a user interface, a restricted region managing module 24, and a cell placing module 26. The cell placing module 26 is provided with functions of a partitioning based replacing module 30 and a cell replacement control module 32. The restricted region specifying module 22 acting as the user interface specifies a restricted region on a chip and a cell maximum activity ratio of the restricted region on the basis of an operative input of the user. FIG. 3 illustrates by way of example a method of specifying the restricted region in which the cell activity ratio is restricted through the restricted region specifying module 22 by the user.

Referring to FIG. 3, a chip region 34 subjected to cell placement processing includes two already placed cells 36 and 38 for example. The already placed cells 36 and 38 can be clock signal transmission cells or RAM or other memory cells. The cells 36 and 38 have respective locations of placement previously fixedly determined in the chip region 34 and are excluded from a target of cell placement effected by the cell placing module 26 of FIG. 2. In the event that the already placed cells 36 and 38 lie in the chip region 34 in this manner, reference is made to the netlist data 12 created by the logic design system 10 of FIG. 1 to acquire the number of wires extending through a region between the already placed cells 36 and 38. By adding to the wires originating from the already placed cells 36 and 38 the cell wires arranged therebetween, it is judged that the region has a higher wiring density. Thus, the user judges that a rectangular region sandwiched by the already placed cells 36 and 38 is a high wiring density region the wiring density of which is expected to increase. The user then specifies this region as a restricted region 40 in which the cell activity ratio is restricted. After the rectangular region between the already placed cells 36 and 38 has been specified as the restricted region 40 by the user in this manner, specification is made of the cell maximum activity ratio of the restricted region 40. For the specification of the cell maximum activity ratio, a total cell activity ratio $\rho(T)$ of the chip region 34 is first determined. That is, it is given as $$\rho(T)=\text{(total cell area)/(chip region area)}$$

In this case, the placement areas of the already placed cells 36 and 38 are excluded from the chip region area since they result in cell prohibition regions. Naturally, the cell areas of the already placed cells 36 and 38 are also excluded from the total cell area. The total cell activity ratio $\rho(T)$ of the chip region 34 is figured out in this manner, so that if $\rho(T)=70\%$, then $\rho(i)=50\%$ is specified as the cell maximum activity ratio of the restricted region 40 between the already placed cells 36 and 38. In the event of this type of computer aided automatic design of large-scale integrated circuits, the total activity ratio of the chip region 34 is empirically 60 to 70%. It is therefore desired that the restricted region 40 have an activity ratio of 50% for example which is lower than the ordinary activity ratio. The activity ratio of the restricted region 40 may vary depending on the total activity ratio. For example, if the total activity ratio is 80%, then the activity ratio of the restricted region 40 is 60%, and if the total activity ratio is 60%, then the activity ratio of the restricted region 40 is 40%. That is, as long as the activity ratio of the restricted region 40 is lower than the activity ratio of the non-restricted region, any appropriate value could be specified as needed.

Figure 4A:
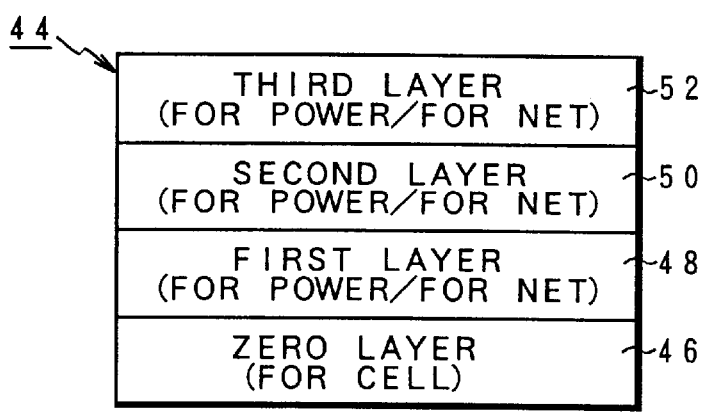
FIGS. 4A to 4C are explanatory diagrams of a user specification of a restricted region on a cell placement layer, allowing for a connection with power lines on the other layers.
Figure 4B:
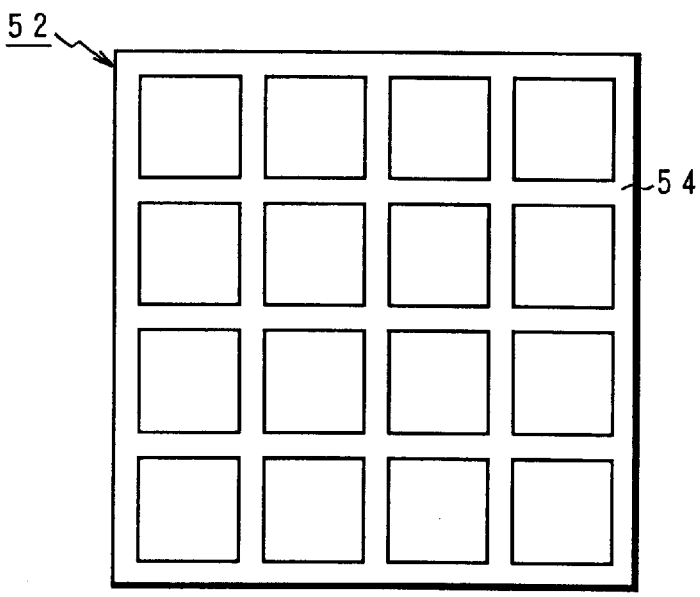
Figure 4C:
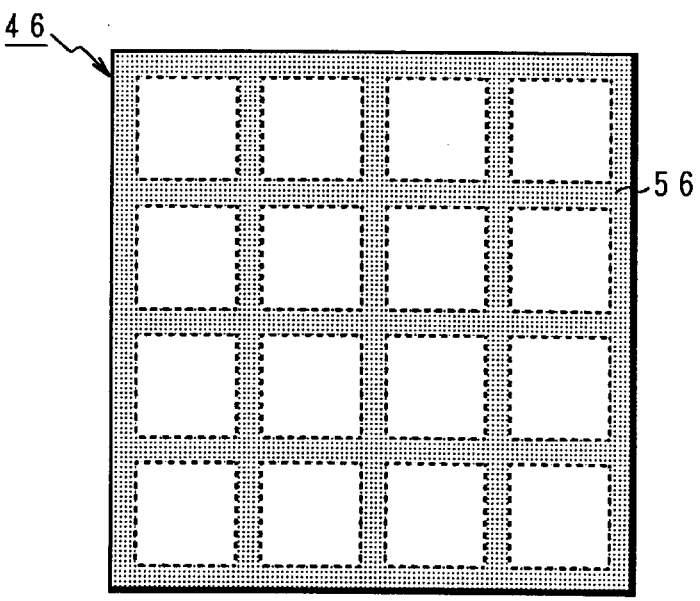

FIGS. 4A to 4C illustrate another example of the restricted region specified by the user through the restricted region specifying module 22 acting as the user interface of FIG. 2. FIG. 4A is a side elevational view of a chip 44 making up a large-scale integrated circuit which is a target of a cell placement. The chip 44 has for example a four-layered structure consisting of a zeroth layer 46, a first layer 48, a second layer 50 and a third layer 52. Among them, the zeroth layer 46 is used for the cell placement, with the remaining first layer 48 to third layer 52 being used for power supply and signal transmission schemes. FIG. 4B is a top plan view of the third layer 52 of FIG. 4A. The third layer 52 has power lines 54 formed in a grid pattern thereon, with the through-holes extending orthogonally to the power lines 54 for the connection therewith, to ensure a power supply to the underlying zeroth layer 46 to the second layer 50. The width of the power lines 54 is sufficiently larger than the size of cells arranged in the zeroth layer 46 and includes a multiplicity of cells therein. FIG. 4C is a top plan view of the zeroth layer 46 of FIG. 4A. The cells lie within a gridd region 56 indicated by slanted lines 56 and corresponding to the power lines 54 of the third layer 52 of FIG. 4B. The cells are supplied with power through the wiring connection extending orthogonally to the power lines 54 of the third layer 52 and form a region having a higher wiring density. Then, the operator specifies, as the restricted region 56 in which the cell activity ratio is restricted, the hatched region of the zeroth layer 46 of FIG. 4C corresponding to the power lines 54 of the chip region. After the specification of the restricted region 56 corresponding to the power lines 54 in this manner, the user figures out the total cell activity ratio using the zeroth layer 46 as the cell region to thereby apply to the restricted region 56 an activity ratio lower than the total cell activity ratio. For example, in the same manner as FIG. 3, if the total activity ratio is 70%, then the activity ratio of 50% is applied to the restricted region 56 corresponding to the power lines.

Referring again to FIG. 2, when the user specifies for example the restricted region 40 or 56 as in FIGS. 3 or 4C and its cell activity ratio through the restricted region specifying module 22, the thus specified restricted region and cell activity ratio are fed to the restricted region managing module 24 in which they are managed as control parameters for use in the cell placement processing effected by the cell placing module 26. The cell placing module 26 places cells on a target chip on the basis of the netlist data 12 by use of the partitioning based placing module 30. At that time, the cell placement control module 32 controls assignment of cells based on the user specified restricted region and its cell activity ratio being managed in the restricted region managing module 24. Brief description is made of the cell placement effected by the partitioning based placing module 30. Iterating sequential bisecting of the target chip region, the partitioning based placing module 30 groups the chips so as to minimize the cost indicative of the number of nets between the bisected regions for each partitioning. In response to such a cell placement of the partitioning based placing module 30, the cell placement control module 32 provides a control of cell grouping in the partitioning based placing module 30 in such a manner that every time the partitioning based placing module 30 performs chip grouping based on the bisecting of the chip region, the total area (S1+S2) of the two bisected regions is proportionally divided in accordance with the ratios, to the total cell area s of the two regions, of cell effective areas s1' and s2' of the respective regions based on the cell maximum activity ratio of the restricted region, to thereby obtain converted areas S1' and S2' for the respective regions and that a difference in ratios of the cell total area s of the respective regions relative to the converted area S1' and S2' lies within a predetermined range.

The details of the processing of the partitioning based placement module 30 and the cell placement control module 32 will be described later.

Figure 5:
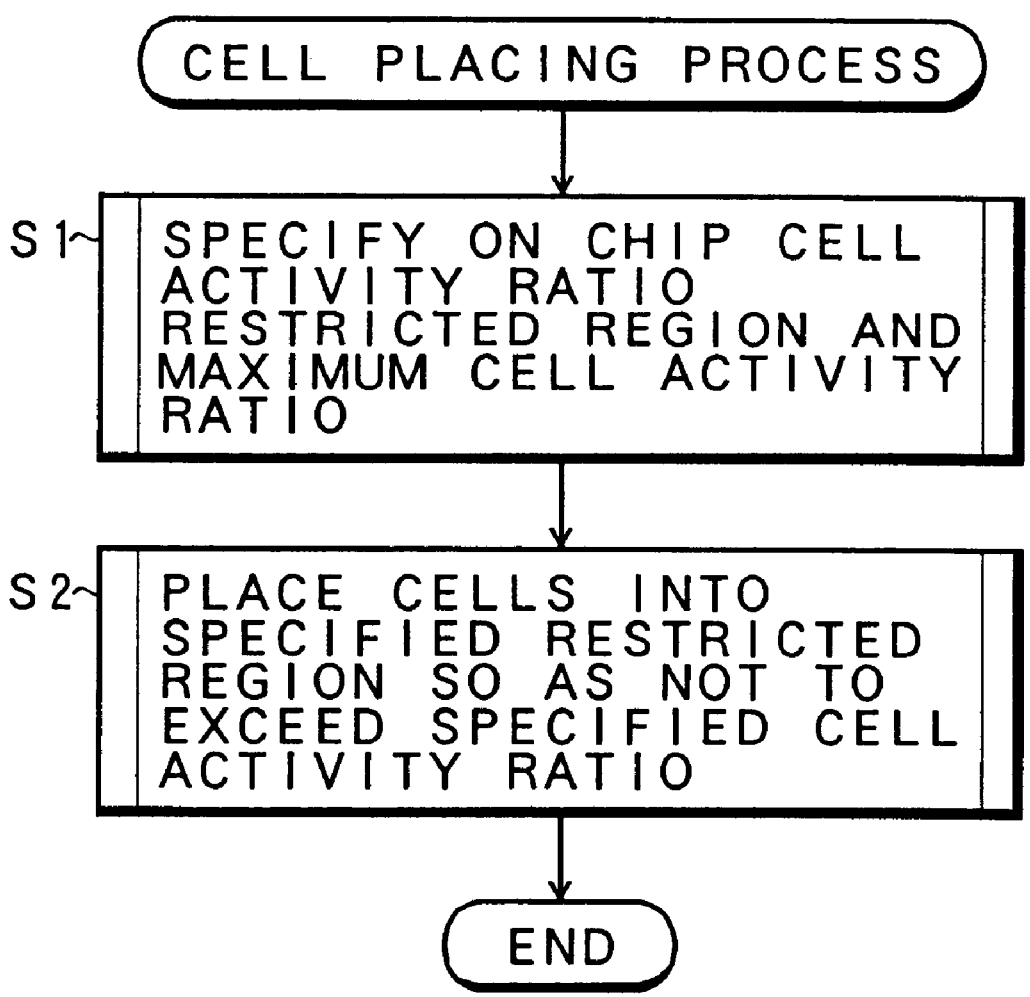
FIG. 5 is a general flowchart of cell placement processing of FIG. 2.

FIG. 5 is a generic flowchart of the cell placement processing of FIG. 2. In the even of this cell placement processing, specification is first made of a restricted region in which the cell activity ratio is restricted on a chip and of its cell activity ratio in step S1. In case of the embodiment of FIG. 2, specified as the cell activity ratio restricted region through the restricted region specifying module 22 acting as the user interface is a region which is expected to have a higher wiring density on the chip as shown in FIG. 3 or FIGS. 4A to 4C, with this restricted region being given for example 50% activity ratio which is lower than the cell total activity ratio. Then procedure advances to step S2 in which the cell placing module 26 performs a cell placement so as not to exceed the specified cell activity ratio in the specified cell activity ratio restricted region.

FIG. 6 is a detailed flowchart of the cell activity ratio restricted region specification processing of step S1 of FIG. 5, which is performed by the user using the restricted region specifying module 22 acting as the user interface of the embodiment of FIG. 2. In the event of this user-specified restricted region specification processing, in step S1 placement is made of already placed cells, if any, having locations of placement fixedly determined as shown in FIG. 3. Then, set in step S2 are regions of connection, to the cell placement layer, of the other layers for power source or nets as shown in FIGS. 4A to 4C. Then in step S3, it is judged that the region between the already placed cells 36 and 38 of FIG. 3 or the region 56 corresponding to the power lines of the other layer of FIG. 4C is a region having a higher wiring density, to specify the cell activity ratio restricted region to apply to this restricted region an activity ratio lower than that of the other regions.

Figure 8A:
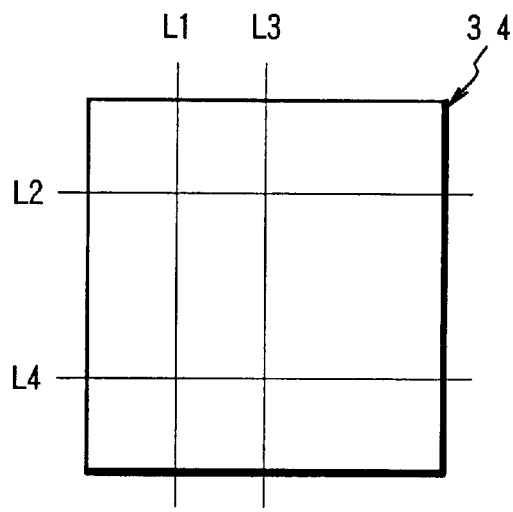
FIGS. 8A to 8D are explanatory diagrams of a target chip region partitioning method of FIGS. 7A and 7B.
Figure 8B:
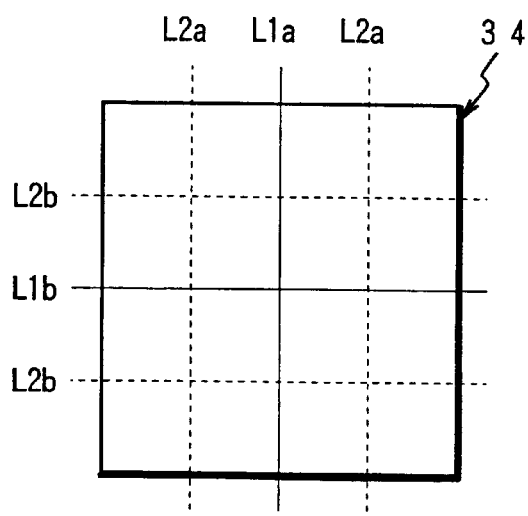
Figure 8C:
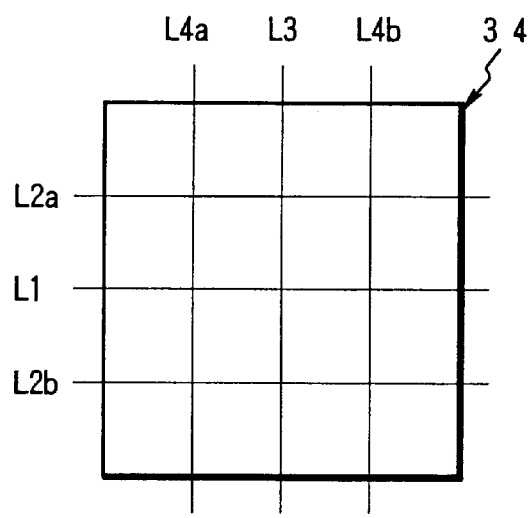
Figure 8D:
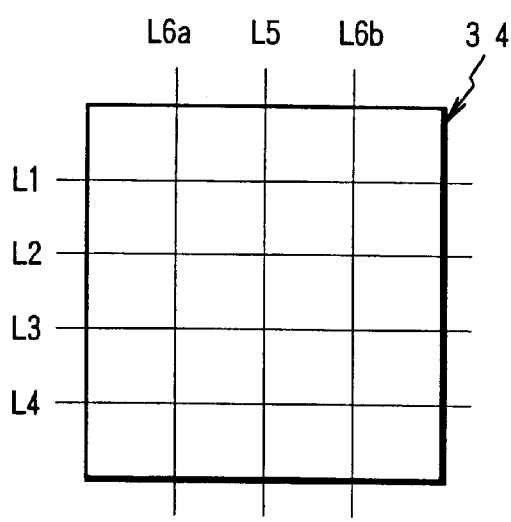

FIGS. 7A and 7B are flowcharts of the cell placement processing for placing the cells in the specified cell activity ratio restricted region so as not to exceed the specified cell activity ratio of the generic flowchart of FIG. 5. That is, they are flowcharts of the cell placement processing effected by the partitioning based placing module 30 and the cell placement control module 32 provided in the cell placing module 26 of FIG. 2. Performed in steps S1 and S2 is the processing of the partitioning based placing module 30 in the cell placing module 26 of FIG. 2, whereas performed in remaining steps S3 to S11 is the processing of the cell placement control module 32. First, in the event of the cell placement processing effected by the partitioning based placing module 30, in step S1 the target chip region is bisected into two, and then in step S2 the cells in the target chip region are assigned to the two bisected regions for grouping so as to minimize the cost of net between the regions, to thereby determine the placement candidate. The bisecting of the target chip region in step S1 is carried out as shown in FIGS. 8A to 8D. FIG. 8A illustrates partitioning method in which the target chip region 34 is alternately bisected in the order of a vertical line, a horizontal line, a vertical line and a horizontal line. For example, the partitioning is carried out by using a vertical line L1, a horizontal line L2, a vertical line L3 and a horizontal line L4 and is iterated until the size of each region reaches a predetermined minimum block size accommodating a single cell. FIG. 8B illustrates partitioning method in which the target chip region is simultaneously quadrisected into the same size. More specifically, in the first time, a vertical line L1$a$ and a horizontal line L1$b$ are simultaneously drawn to partition the region into four regions having the same size. In the second time, two vertical lines L2$a$ and two horizontal lines L2$b$ are drawn on the four partitioned regions to obtain four partitioned regions having the same size from each partitioned region. FIG. 8C illustrates partitioning method in which a horizontal line L1 and then two horizontal lines L2$b$ are drawn to partition the region into a minimum size in the vertical direction and then a vertical line L3 and the two vertical lines L4$a$ are drawn to sequentially partition the regions into a minimum size in the horizontal direction. FIG. 8D illustrates partitioning method in which horizontal lines L1 to L4 are drawn in the mentioned order to partition the region into a minimum size in the vertical direction and then a vertical line L5 and two vertical lines L6$b$ are drawn in the mentioned order to sequentially partition the regions into a minimum size in the horizontal direction. Each partitioning method of FIGS. 8A to 8D groups the cells so as to minimize the cost of net between regions as a result of bisecting of a single target region.

The following are algorithms for grouping the cells so as to minimize the cost of net between the two partitioned regions of step S2 of FIG. 7A.

I. Kernighan-Lin algorithm (K-L algorithm)

II. Expanded K-L algorithm

III. Fiduccia-Mattheyses algorithm

Figure 9A:
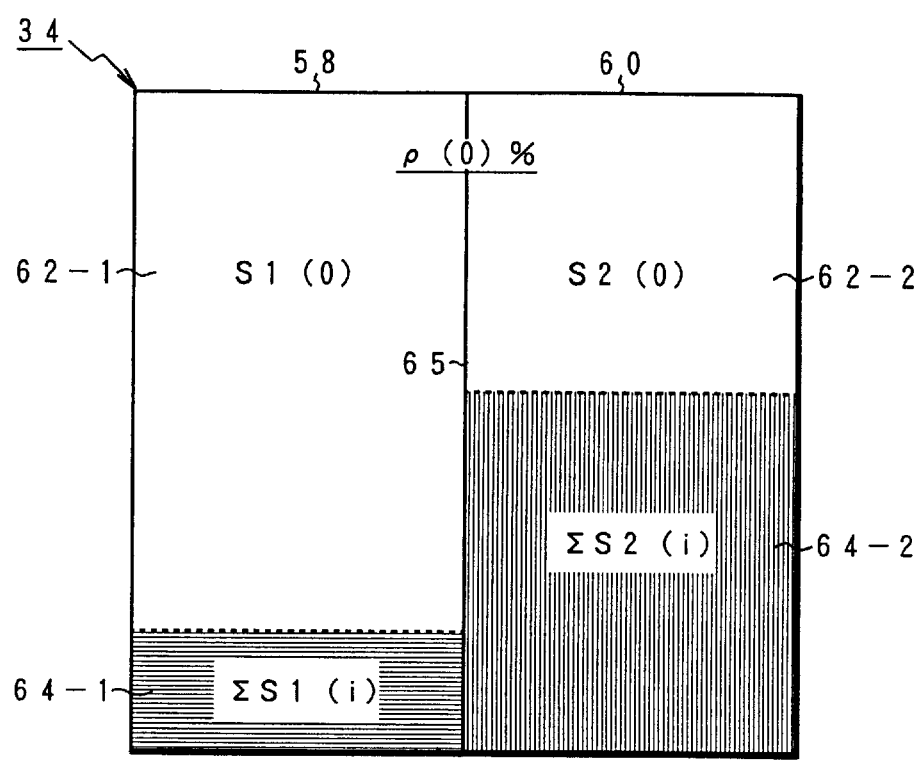
FIGS. 9A and 9B are explanatory diagrams of area conversion of partitioned regions on the basis of the restricted region and the cell maximum activity ratio in the cell placement processing of FIGS. 7A and 7B.

These algorithms are disclosed in for example "ALGORITHMS FOR VLSI PHYSICAL DESIGN AUTOMATION" (written by Naveed Sherwany, Kluwer Academic Publishers, 1995). Although in step S2 the grouping is made so as to minimize the cost of net between the partitioned two regions to determine a placement candidate, the thus determined placement candidate is treated as a first candidate, with the grouping results of the other lower candidates requiring larger costs such as a second candidate, a third candidate, a fourth candidate, etc., being also saved. When in step S2 a placement candidate is determined on the basis of grouping of the cells minimizing the cost of net, the processing of steps S3 to S11 is carried out by the cell placement control module 32 of FIG. 2. Referring to FIG. 9A illustrating a first region 58 and a second region 60 obtained as a result of bisecting, acquired for the processing of the steps S3 to S11 are an area S1 of the first region 58, an area S2 of the second region 60, a total area s1 of cells assigned to the first region 58, a total area s2 of cells assigned to the second region 60, a cell total area s (=s1+s2), an area S1(i) of a portion belonging to the first region 58 of an i-th restricted region in the target chip region 34, an area S2(i) of a portion belonging to the second region 60 of the i-th restricted region, and a cell activity ratio ρ(i) specified in the i-th restricted region. Under such conditions, the following expression is first used in step S3 to figure out an area S1(0) of a portion free from any cell activity ratio restriction in the first region 58.

$$S1(0)=S1-\Sigma S1(i) \tag{2}$$

Then in step S4, the following expression is used to figure out an area S2(0) of a portion free from any cell activity ratio restriction in the second region 60.

$$S2(0)=S2-\Sigma S2(i) \tag{3}$$

In a manner corresponding to the steps S3 and S4, FIG. 9A illustrates portions 62-1 and 62-2 free from any cell activity ratio restriction of the first region 58 and the second region 60, respectively, separately from the cell activity ratio restricted portions 64-1 and 64-2 indicated by the slanted lines. The portions 62-1 and 62-2 have their respective areas S1(0) and S2(0). Then the procedure advances to step S5 in which the following expression is used to figure out the activity ratio ρ(0) of the portions 62-1 and 62-2 free from any cell activity ratio restriction in the entire target chip region 34.

$$\rho(0)=\{(\text{total cell area})-(\text{total cell area of activity ratio specified regions})\}/(\text{total area})=[s-\Sigma\{\rho(i)\times(S1(i)+S2(i))\}]/S1(0)+S2(0) \tag{4}$$

Then the procedure goes to step S6 in which the following expression is used to figure out cell effective areas s1' and s2' of the first region 58 and the second region 60, respectively, on the basis of the activity ratio ρ(0) of the portion free from any cell activity ratio restriction obtained in step S5 and of the already specified activity ratio ρ(i) of the cell activity ratio restricted portions.

$$s1'=\rho(0)\times S1(0)+\Sigma\{\rho(i)\times S1(i)\} \tag{5}$$

$$s2'=\rho(0)\times S2(0)+\Sigma\{\rho(i)\times S1(i)\} \tag{6}$$

Then the procedure goes to step S7 in which the following expression is used to figure out the converted areas S1' and S2' by proportionally dividing the area of the target chip region 34, that is, the total region area (S1+S2) of the first and second regions using ratios, to the cell total area s, of the cell effective areas s1' and s2' of the first and second regions 58 and 60 obtained in step S6.

$$S1'=(S1+S2)\times(s1'/s) \tag{7}$$

$$S2'=(S1+S2)\times(s2'/s) \tag{8}$$

Figure 9B:
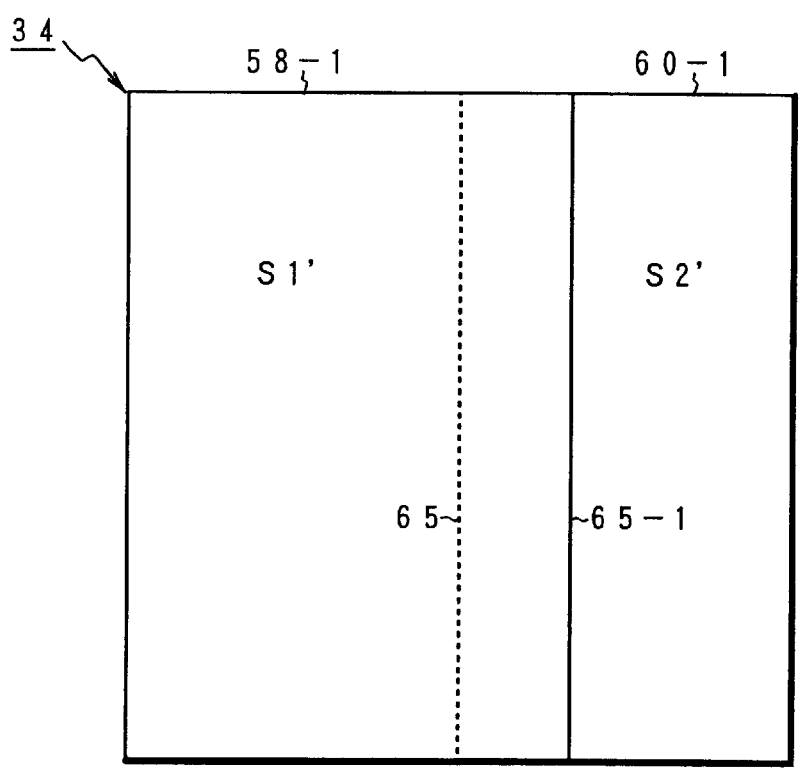

After the acquisition of the converted areas S1' and S2' of converted regions 58-1 and 60-1 of FIG. 9B as a result of the conversion of the first and second regions 58 and 60 in this manner, it is judged whether there is satisfied or not a condition for keeping equal to or less than a predetermined value "a" the absolute value of a difference between the ratios, to the converted areas S1' and S2', of the cell areas s1 and s2 of the original first and second regions 58 and 60 of FIG. 9A. That is, the judgment is made of the condition of $$|s1/S1'-s2/S2'|\leq\alpha \tag{9}$$

If the condition of the expression (9) is satisfied, the placement candidate determined in step S2 is considered as one not allowing any excess of the specified activity ratio of the specified restricted region. Thus, in step S9, a check is made to see if the size of the block is the minimum block size. If not, the procedure goes back to step S1 in which the first region 58 and the second region 60 are each divided into upper and lower regions by a horizontal line so that the processing of the steps S2 to S9 is iterated on the respective two regions until the minimum block size is achieved in step S9. On the contrary, if the condition of the expression (9) is not satisfied in step S8, then the procedure goes to step S10 in which selection is made of the second candidate having a larger cost than the first placement candidate determined in the step S2 so that the processing of the steps S3 to S8 is iterated for the grouping of the cells as the second candidate. As a result of this, a candidate satisfying the condition of the step S8 is selected from among the plurality of candidates determined in the step S2. After the completion of the processing up to the minimum block size in step S9, the cell placement result is saved in step S1 to complete a series of cell placement processes, allowing the procedure to advance to the wiring processing effected by the inter-cell wiring system 20 of FIG. 1. According to the cell placement processing by the present invention shown in the flowchart of FIGS. 7A and 7B, partitioning is made into the converted regions 58-1 and 60-1 as shown in FIG. 9B in accordance with the expressions (2) to (8), upon the execution of the grouping in which the region is bisected into the first region 58 and the second region 60 so that the cells are assigned thereto so as to minimize the cost of net. The cells are assigned to the converted regions 58-1 and 60-1 so as to satisfy the condition of the expression (9), that is, so as to allow the difference between the cell activity ratios to lie within a range of ±α, with a boundary line 65-1 obtained by moving the original boundary line 65 between the first region 58 and the second region 60 of FIG. 9A toward the second region 60 having a larger cell activity ratio restricted portion 64-2. This results in a reduction of the converted area S2' of the converted region 60-1 of the second region 60 having a larger cell activity ratio restricted portion 64-2 of FIG. 9A, expelling the cells to be assigned to the second region 60 toward the first region 58. As a result of this, the similar cell assignment processing after the partitioning into the minimum block size enables the cell activity ratio restricted portions 64-1 and 64-2 of FIG. 9A to have a cell placement so as not to allow the excess of the respective specified cell activity ratios.

Figure 10:
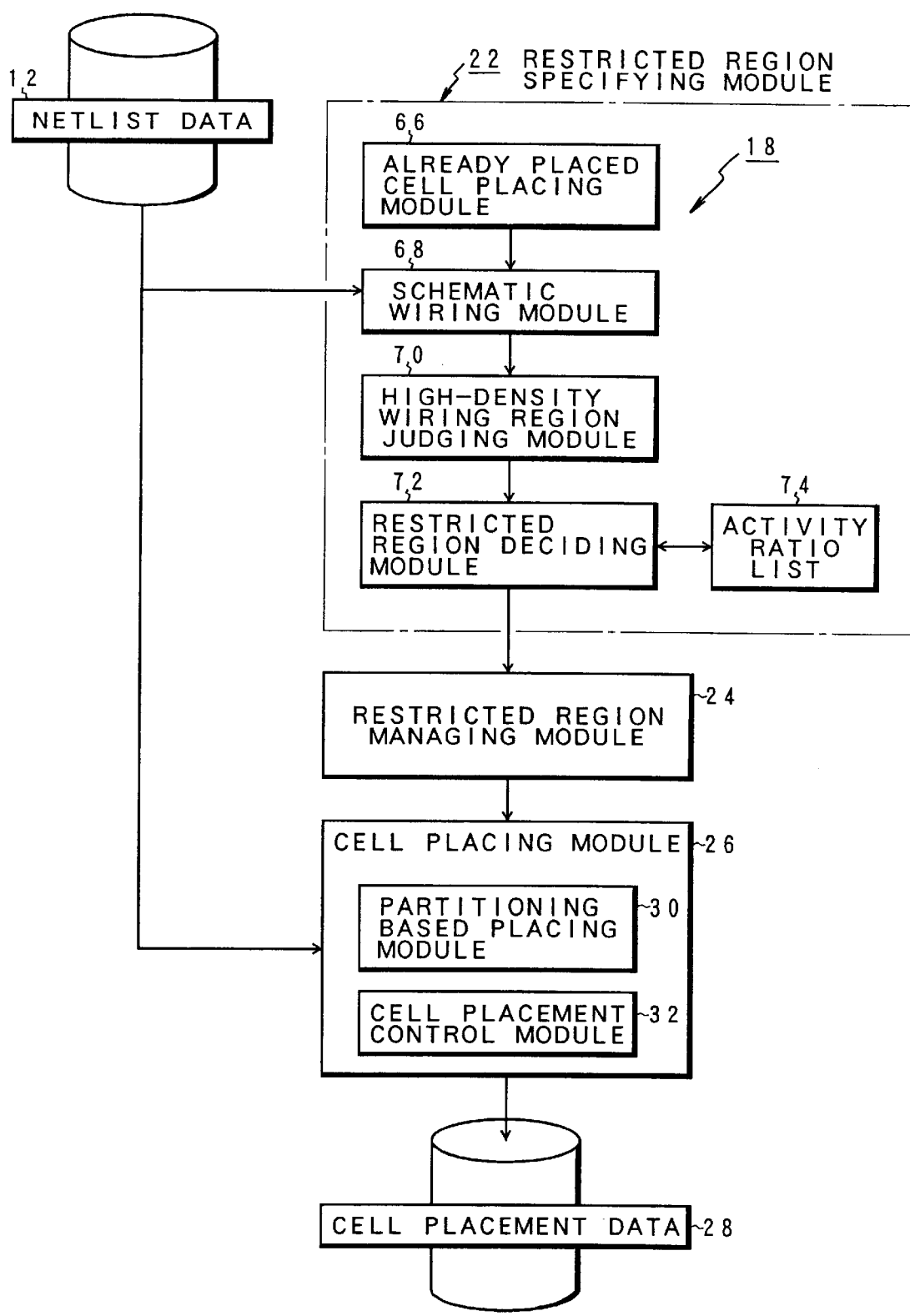
FIG. 10 is a function block diagram of a cell placement apparatus of the present invention for automatically specifying a restricted region on the basis of already placed cells.
Figure 11:
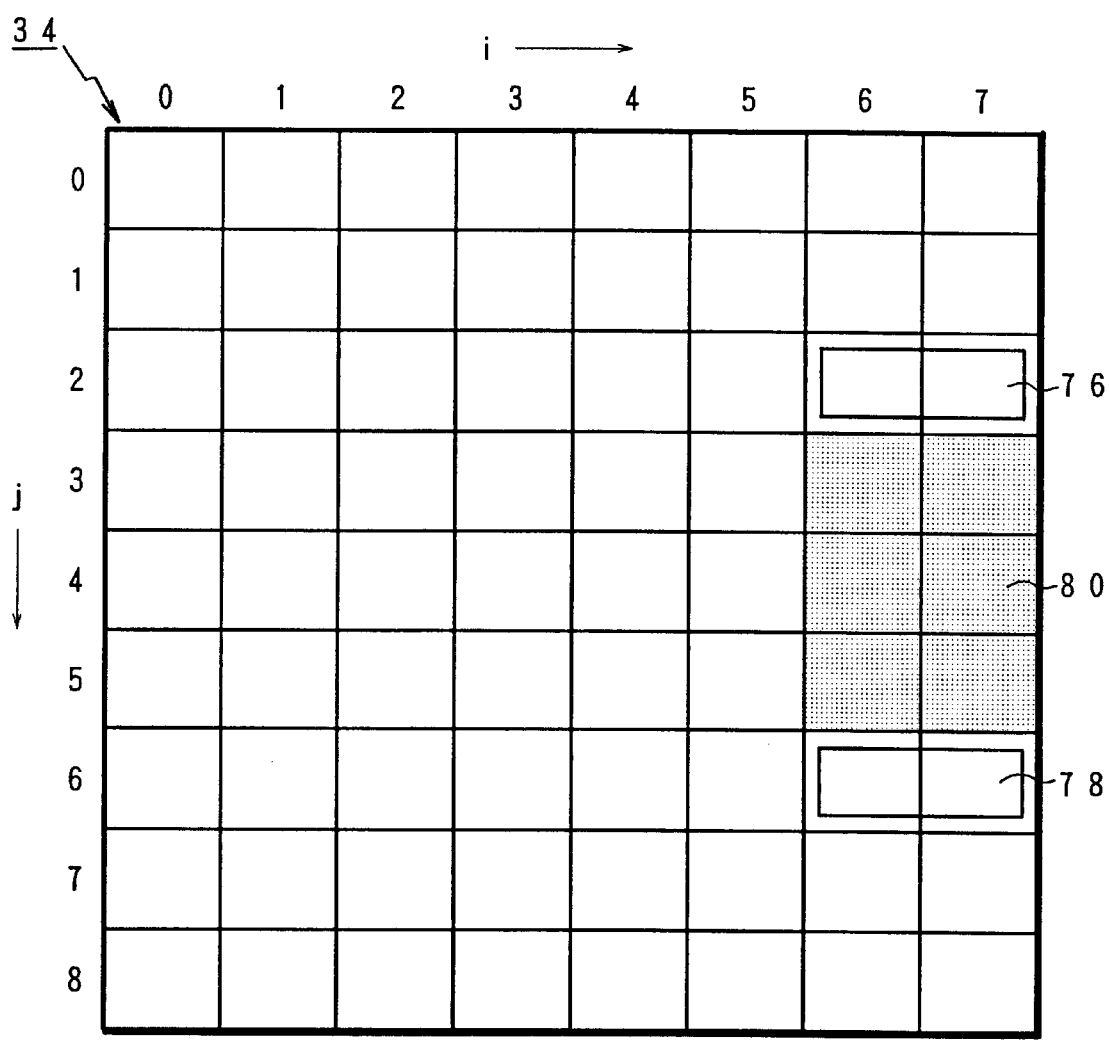
FIG. 11 is an explanatory diagram of restricted region determination processing based on the already placed cells on the chip in accordance with the embodiment of FIG. 10.
Figure 12:
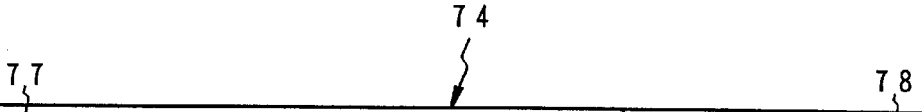
FIG. 12 is an explanatory diagram of an activity ratio list of FIG. 10.

FIG. 10 is a function block diagram of a second embodiment of the cell placement apparatus of the present invention implemented as the cell placement system 18 provided in the layout design system 14 of FIG. 1. The second embodiment is characterized in that a specification of the cell activity ratio restricted region is automatically made on the basis of the placement of the already placed cells relative to the chip. The cell placement system 18 making up the cell placement apparatus of the present invention comprises the restricted region specifying module 22, the restricted region managing module 24 and the cell placing module 26. The cell placing module 26 is provided with the partitioning based placing module 30 and the cell placement control module 32 so that the cell replacement data 28 obtained by the cell placement processing of the cell placing module 26 are stored in a file. This configuration is basically the same as that of the first embodiment of FIG. 2 although in the first embodiment the user specifies a restricted region and its cell maximum activity ratio whereas in the second embodiment of FIG. 10 the restricted region specifying module 22 determines automatically without requiring any operation of the user the restricted region in which the cell activity ratio is restricted and its cell maximum activity ratio on the basis of the netlist data 12 obtained by the processing of the logic design system 10 of FIG. 1. To this end, the restricted region specifying module 22 is provided with an already placed cell placing module 66, a rough wiring module 68, a high-density wiring region judging module 70, restricted region deciding module 72 and an activity ratio list 74. As shown in FIG. 11, for example, the already-placed cell placing module 66 places already placed cells 76 and 78 of which placement locations are fixedly determined for example at predetermined locations on the target chip region 34 excepting the upper limit of the already placed cells contained in the netlist data 12. The rough wiring module 68 performs a rough wiring for the two already placed cells 76 and 78 for example arranged on the target chip 34 of FIG. 11. This rough wiring is carried out by utilizing a grid graph which will be described later for example on the basis of the netlist of the already placed cells 76 and 78. The high-density wiring region judging module 70 partitions the target chip region 34 into blocks having a predetermined size as shown in FIG. 11 and detects the wiring density from the result of the rough wiring for the already placed cells 76 and 78 effected by the rough wiring module 68 for each block, to thereby judge whether each block is a high-density region or not. In case of the placement of the two already placed cells 76 and 78 of FIG. 11, it can be judged from the rough wiring that six blocks therebetween are high-density wiring regions. In this case, blocks of the target chip region 34 are designated at i=0 to 7 in the horizontal direction and at j=0 to 8 in the vertical direction with the upper left corner as the origin, so that an arbitrary block can be represented as Bij. Thus, judged as the high-density wiring region blocks are six blocks B63, B64, B65, B73, B74 and B75 lying between the two already placed cells 76 and 78. The restricted region deciding module 72 decides as a restricted region in which the cell activity ratio is restricted the region formed from the blocks judged to be a high-density wiring region by the high-density wiring region judging module 70. More specifically, the six blocks between the two already placed cells 76 and 78 are judged to be a high-density wiring region in FIG. 11, so that the region consisting of the six blocks is decided to be a restricted region 80. Then the restricted region deciding module 72 decides the cell maximum activity ratio for restricting the activity ratio of the decided restricted region to be a lower value than the ordinary cell activity ratio. Reference is made to the activity ratio list 74 in order to decide the cell maximum activity ratio of the restricted region 80. This activity ratio list 74 stores a total cell activity ratio 77 and a restricted region cell activity ratio 78 as shown in FIG. 12. The total cell activity ratio 77 is classified into three stages, that is, 50 to 60%, 60 to 70% and 70 to 80%. Corresponding to this, the restricted region cell activity ratio 78 is set to 40%, 50% and 60%. After the decision of the restricted region 80 for the target chip region 34, as shown in FIG. 11, the restricted region deciding module 72 figures out the total cell activity ratio by dividing the cell total area by the chip area and refers to the activity ratio list 74 of FIG. 12, to thereby select the restricted region cell activity ratio 78 corresponding to the total cell activity ratio 77 in question. If for example the total cell activity ratio 77 lies between 60 to 70%, 50% of the restricted region cell activity ratio 78 is selected and used as the cell maximum activity ratio of the restricted region 80 of FIG. 12.

Figure 13:
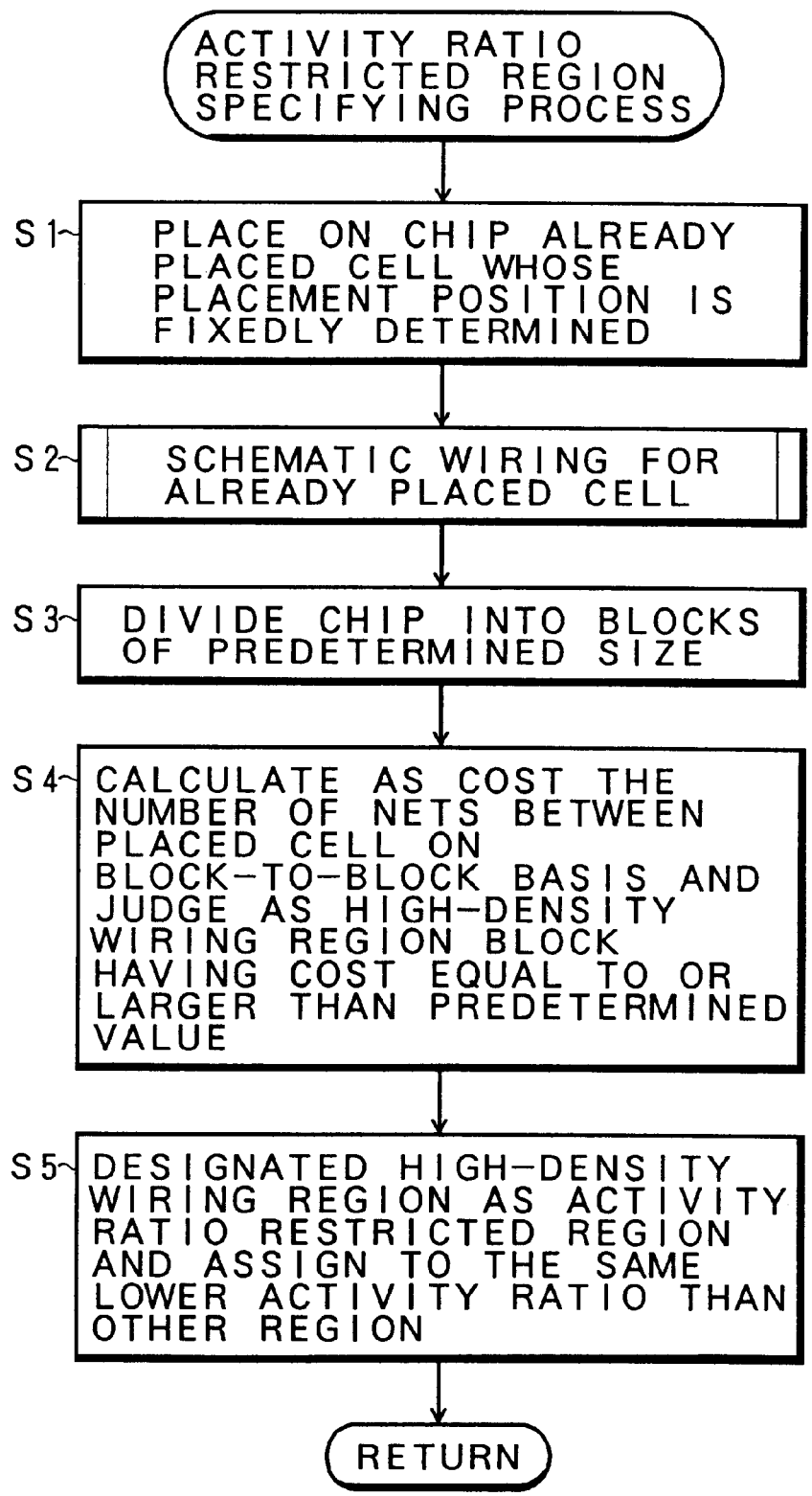
FIG. 13 is a detailed flowchart of restricted region specification processing of FIG. 10 based on the already placed cells.

FIG. 13 is a flowchart of the specification processing of the restricted region and the cell activity ratio effected by the restricted region specifying module 22 of FIG. 10. First arranged on a target chip in step S1 are already placed cells whose placement locations are fixedly determined. Then in step S2, use is made of a grid graph for example to perform the rough wiring for the already placed cells arranged on the chip. Then in step S3, the chip is partitioned into blocks having a predetermined size. In step S4, the number of nets between the placed cells is calculated as the cost for each block to judge the blocks having a cost equal to or larger than a predetermined value to be a high-density wiring region. Finally in step S5, the high-density wiring region is decided as the cell activity ratio restricted region and is given a lower activity ratio than that of the other regions through the reference to the activity ratio list 74 as shown in FIG. 12 for example. The restricted region managing module 24 of FIG. 10 accepts the thus automatically determined restricted region and its cell activity ratio, and saves them for the placement processing by the cell placing module 26. The processing of the first embodiment of FIG. 2 applies to the cell placement processing by the cell placing module 26 based on the restricted region managed by the restricted region managing module 24 and on its cell activity ratio. More specifically, a cell placement is carried out in accordance with the flowchart of the cell placement processing of FIGS. 7A and 7B so that the cells can be arranged on the restricted region having a specified cell activity ratio so as not to exceed the specified cell activity ratio.

FIG. 14 is a flowchart of the rough wiring processing for the already placed cells in the step S2 of the activity ratio restricted region specification processing of FIG. 13. In this rough wiring processing, the wiring processing in the inter-cell wiring system 20 of FIG. 1 is carried out through two-stage processing consisting of I. 1-st stage global routing (loose routing)

II. Detailed routing

The high-speed rough wiring can be realized by utilizing the global routing performed in the first stage. In this global routing, only the wiring assignment to each net is carried out on the basis of the netlist upon the completion of the cell placement without performing any layout of the actual physical wiring. The wiring processing for the global routing includes techniques such as a grid graph model, a checker board model and a channel intersection graph model, although the rough wiring processing of FIG. 14 makes use of the grid graph model which is easy to handle.

Figure 15A:
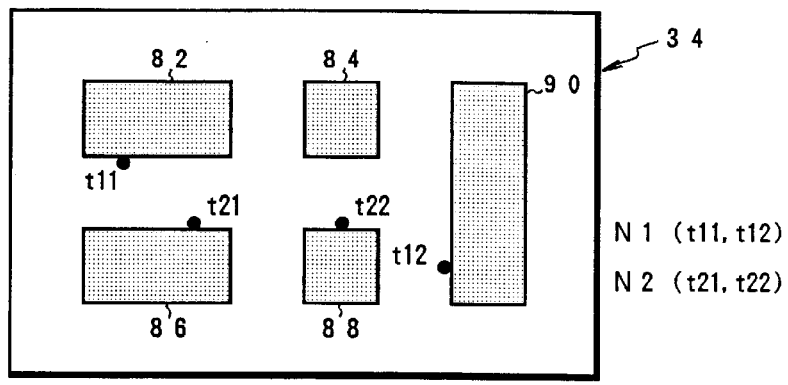
FIGS. 15A to 15D are explanatory diagrams of the rough wiring processing of FIG. 14.

The rough wiring processing of FIG. 14 is described hereinbelow with reference to the explanatory diagram of the wiring processing effected by use of the grid graph model of FIGS. 15A to 15D. First in step S1, pin assignment is made to placement cells of which placement has been determined on the chip. FIG. 15A presents a status in which cells 82, 84, 86, 88 and 90 have been placed on the target cell 34. Pins t11, t12, t21 and t22 are assigned to these cells as shown for example.

Herein, the netlists corresponding to the pins t11 to t22 are assumed to be

N1(t11, t12)

N2(t21, t22)

Figure 15B:
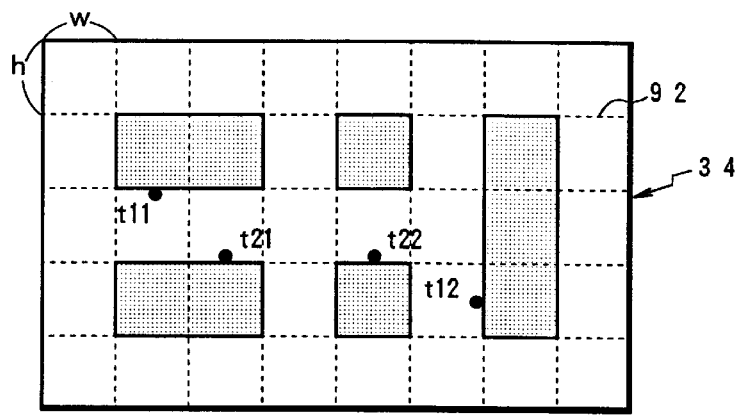
Figure 15C:
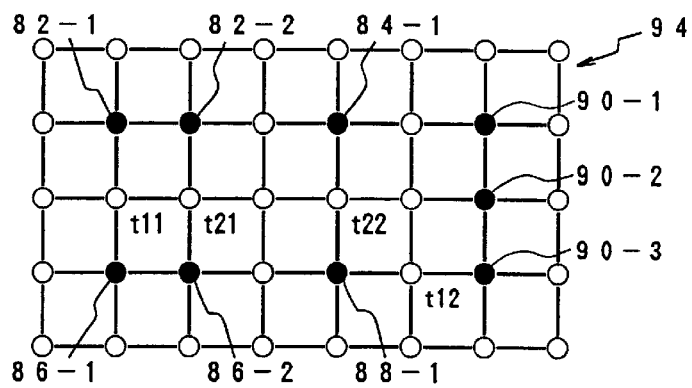
Figure 15D:
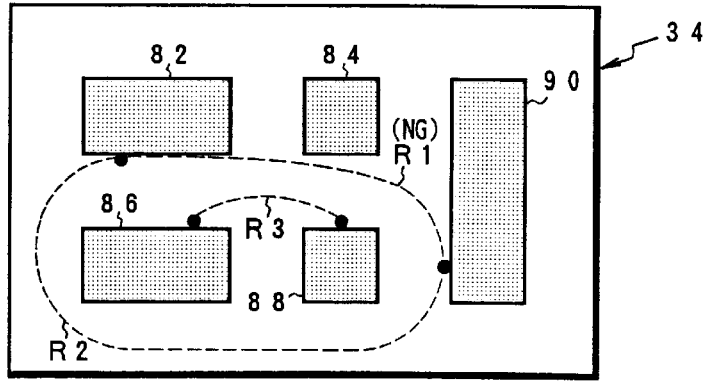

Then in step S2, a grid graph model is created. The grid graph model is created by partitioning the target chip region 34 into rectangular cells by use of horizontal and vertical block lines 92 as shown in FIG. 15B. The rectangular cell size is set to (h×w) where h is a channel width and w is a line width. A grid graph 94 is then created as shown in FIG. 15C. The grid graph 94 is obtained by converting the rectangular cells of FIG. 15C into vertices and joining them by grid lines. Thus, a cell 82 of FIG. 15B is represented as black circular vertices 82-1 and 82-1 in the grid graph 94 of FIG. 15C. The same applies to cells 84, 86, 88 and 90, which are represented as black circular vertices 84-1, 86-1, 86-2, 88-1, 90-1 to 90-3, respectively. The pins t11 to t12 are assigned to corresponding locations of while circular vertices as t11, t12, t21 and t22. After the creation of the grid graph in this manner, the procedure goes to step S3 to determine a path for a net Ni=(t11, t12). In case of the grid graph 94 of FIG. 15C for example, a route for a net N1 (t11, t12) includes a clockwise route R1 and a counterclockwise route R2 as shown in FIG. 15D. However, when the route R1 is viewed from the aspect of the grid graph 94 of FIG. 15C, a path extending from the pin t11 to the pin t12 must cross another net N2 joining the pins t21 and t22. Since the rule for the routing prescribes that a net must not cross another net, the clockwise route R1 is inhibited, allowing a determination of the counterclockwise route R2 which by no means cross the other nets. After the determination of the route for the net N1 in step S3 in this manner, a check is made to see if the entire nets have been completed in step S4. If not, the procedure goes back to the step S3 to further determine a route for a net N2. The net N2 includes a route R3 of FIG. 15D joining the pins t21 and t22. As seen from the grid graph 94, the route R3 does not cross the other nets and hence is employed as the net N2. Such a determination of the routes utilizing the grid graph model allows the rough routes implementing nets between cells located on the chip to be created at a high speed, thereby securely ensuring a determination of the cell activity ratio restricted region through the judgment of a high-density region in the steps S3 to S5 of FIG. 13 and a determination of the cell maximum activity ratio of the thus determined restricted region.

Figure 16:
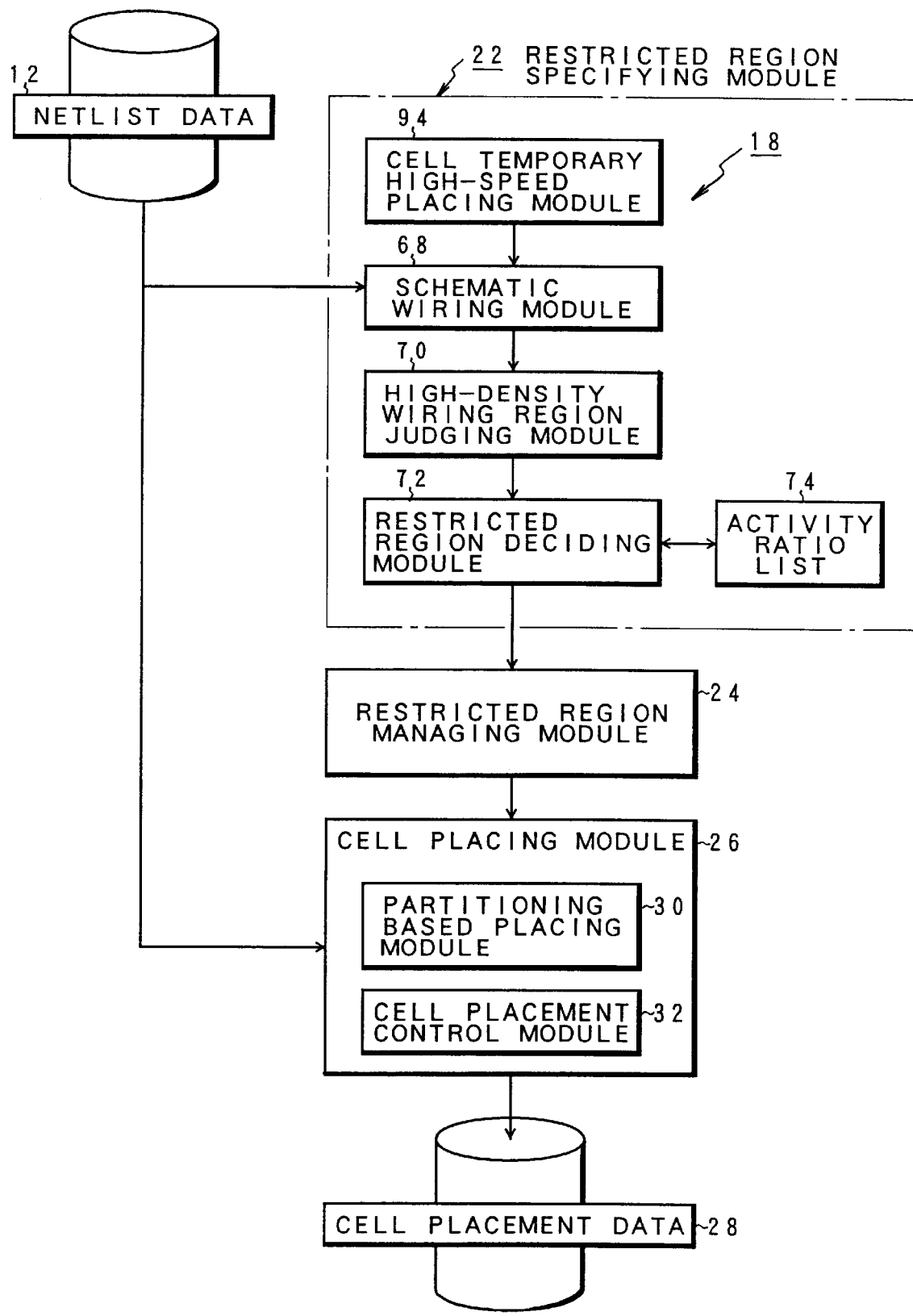
FIG. 16 is a function block diagram of a cell placement apparatus of the present invention for automatically specifying a restricted region on the basis of a tentative high-speed cell placement.

FIG. 16 illustrates a third embodiment of the cell placement apparatus of the present invention provided in the form of the cell placement system 18 included in the layout design system 14 of FIG. 1. This embodiment is characterized in that cells are tentatively placed on a chip at a high speed to perform a rough wiring so that the high density wiring region is automatically recognized and the cell activity ratio restricted region is determined. In the same manner as the first embodiment of FIG. 2 and the second embodiment of FIG. 10, the cell placement system 18 corresponding to the cell placement apparatus of the present invention comprises the restricted region specifying module 22, the restricted region managing module 24 and the cell placing module 26. The restricted region specifying module 22 includes a cell global high-speed placing module 94 in lieu of the already placed cell placing module 66 of the second embodiment of FIG. 10. The remaining configurations are the same as the second embodiment of FIG. 10 which includes the rough wiring module 68, the high-density wiring region judging module 70, the restricted region deciding module 72 and the activity ratio list 74. The cell global high-speed placing module 94 places cells on a chip in a tentative manner. More specifically, use is made of the partitioning based placing module 30 provided in the cell placing module 26 although the block partitioning of the target region for the cell placement is completed for example in the order of one third of the ordinary number of times of partitioning in the partitioning based placing module 30 in order to obtain a medium block size without achieving a minimum block size corresponding to the chip size. In the event of such a cell placement in which the partitioned block size does not reach the minimum block size corresponding to the processed size due to the halfway stop of the partitioning, the optimization of the cell placement is not satisfactory. Thus, in case of the wiring processing using this cell placement result, the wire length tends to increase, making the wiring difficult and resulting in the poor quality. This is unsuitable for wiring processing use. This is however sufficient for the judgment of the high-density wiring region for the restriction of the cell activity ratio and ensures shortened processing time.

Figure 17:
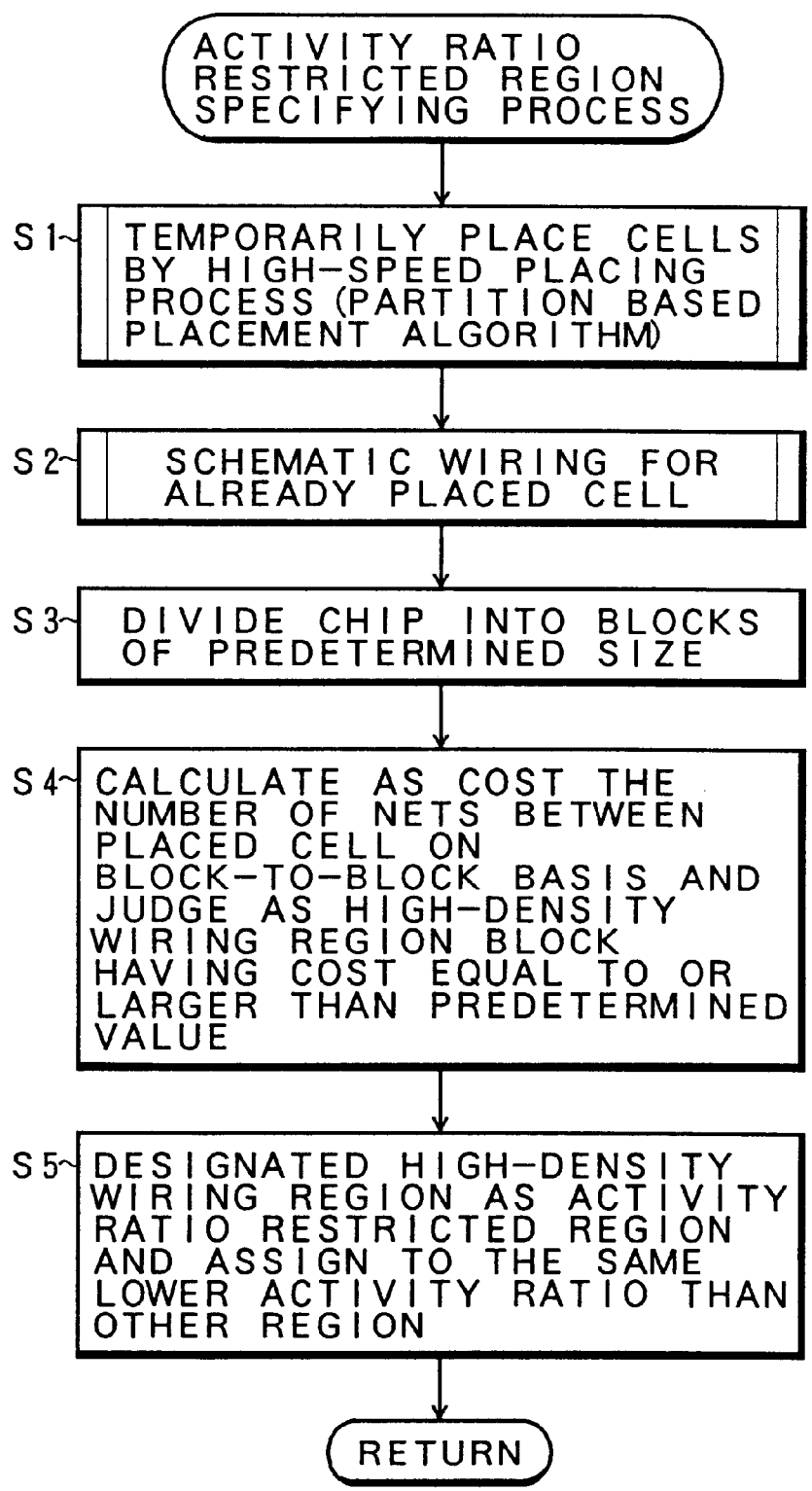
FIG. 17 is a detailed flowchart of the restricted region specification processing of FIG. 16 using the tentative high-speed cell placement.

FIG. 17 is a flowchart of the activity ratio restricted region specification processing effected by the restricted region specifying module 22 of FIG. 16. First in step 1, cells are tentatively placed through the high-speed placement processing. This processing is halfway stopped without completing the region partitioning of the partitioning based placement algorithm into the minimum block size.

Figure 18:
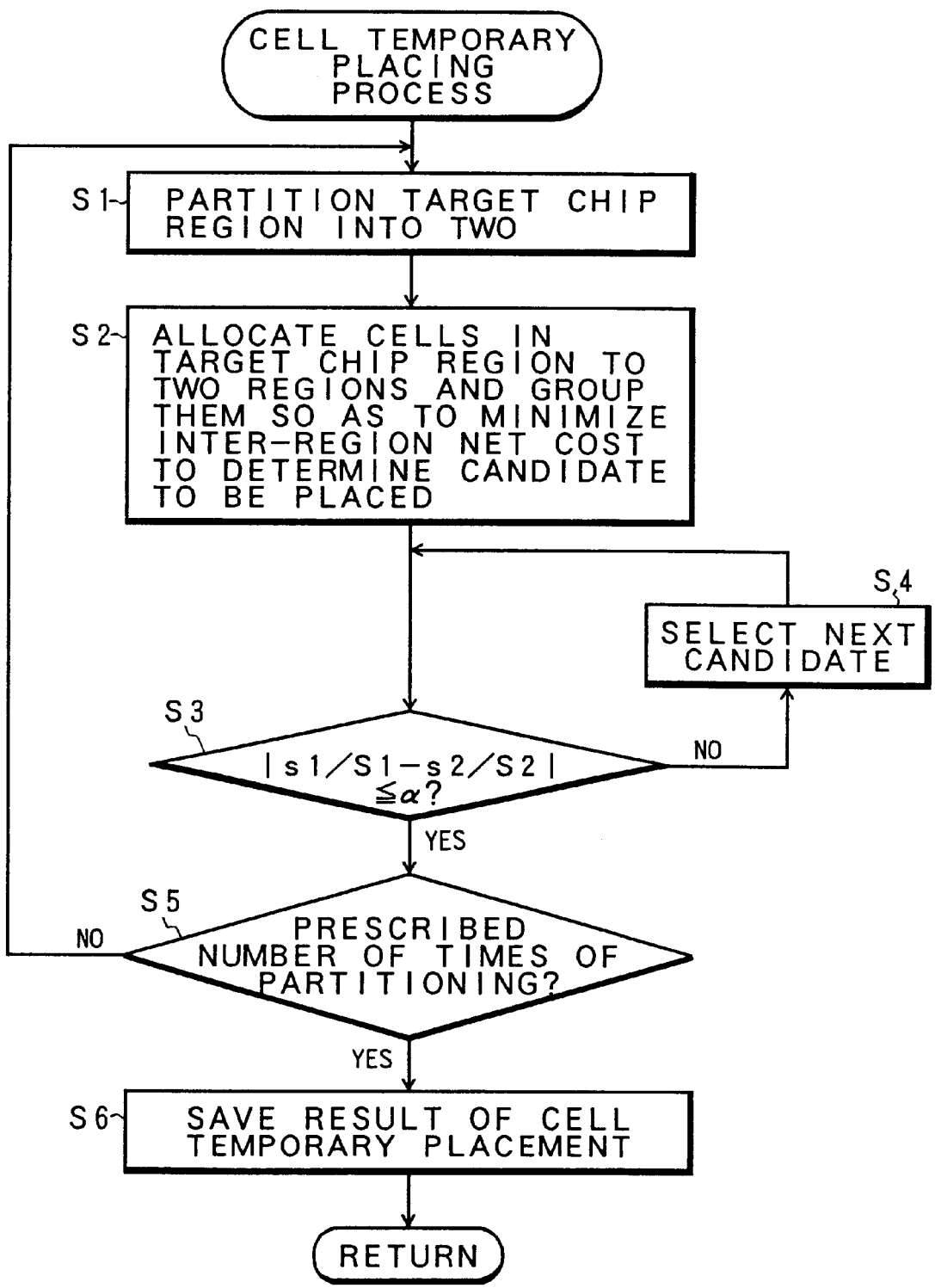
FIG. 18 is a detailed flowchart of the rough wiring processing of FIG. 17.

FIG. 18 is a flowchart of the cell global placement processing of step S1 of FIG. 17. First in step S1, a target chip region is bisected. Then in step S2, cells allocated to the target chip region are assigned to the bisected regions for grouping so as to minimize the cost of net between the regions to thereby determine a placement candidate. In step S3, a check is made to see if the placement candidate satisfies the condition of the following expression.

$$|s1/S1-s2/S2| \leq \alpha \qquad (9)$$

If this condition is not satisfied, then in step S4 selection is made of a second candidate having a higher cost of net and again in step S3 the condition is judged. If the condition of the step S3 is satisfied, then in step S5 a check is made to see if a prescribed number of times of partitioning has been reached which is a halfway value of the partitioning into the minimum block size. The processing of the steps S1 to S4 is iterated until the prescribed number of times of partitioning is achieved. When reaching the prescribed number of times of partitioning, the cell placement processing is completed at that time, and in step S6 the cell global placement result is saved, allowing a return to FIG. 17. Then in step S2 of FIG. 17, a rough wiring is carried out for the tentatively placed cells. In the same manner as the rough wiring module 68 of the second embodiment of FIG. 10, this rough wiring is carried out in accordance with the flowchart of the rough wiring processing of FIG. 14 by making use of the grid graph model. After the completion of the rough wiring for the tentatively placed cells, in step S3 the target chip region 34 is partitioned into blocks each having a predetermined size as shown in FIGS. 11A to 11D. Then in step S4, the number of nets between the placed cells is figured out as a cost for each block so that the block having a cost equal to or larger than a predetermined value is judged to be a high-density wiring region block. Then in step S5, the high-density wiring region is determined as a cell activity ratio restricted region, and simultaneously reference is made to the netlist 74 having the content shown in FIG. 12 to determine the cell activity ratio of the restricted region. The restricted region managing module 24 accepts the restricted region determined from the cell global placement result by the restricted region specifying module 22 of FIG. 16 in this manner as well as the cell activity ratio of the restricted region. The restricted region managing module 24 fetches them as parameters for the cell placement processing effected by the cell placing module 26. Then in the same manner as the cell placement processing of FIGS. 7A and 7B in the first embodiment, the restricted region having a specified cell activity ratio undergoes cell placement processing so as not to exceed the specified cell activity ratio through the cell placement processing effected by both the partitioning based placing module 30 and the cell placement control module 32.

The present invention further provides a computer readable record medium having thereon recorded a cell placement program having a function of the cell placement system 18 implemented by the function blocks of the embodiments shown in FIG. 1, FIG. 10 and FIG. 16. Embodiments of the computer readable record medium having thereon recorded the cell placement program can be for example a removable hand-held storage medium such as a CD-RAM or a floppy disk, a storage apparatus for a program provider who provides a program by way of lines, and a memory device such as a RAM or a hard disk of a program installed processor. The cell placement program provided by the storage medium is loaded into the processor and is run on its main memory.

According to the present invention as described hereinabove, a portion likely to have a high wiring density is specified as a restricted region in which the cell activity ratio is restricted, with the specification of a maximum cell activity ratio in the restricted region, whereby a cell placement is performed so that the cell activity ratio of the specified restricted region does not exceed the specified maximum cell activity ratio, to thereby securely prevent the wiring from becoming difficult because of a higher wiring density of a specific region in the wiring processing after the placement of the cells. Thus, there is little or substantially no need for modification processing such as reexecution of placement of the cells, making it possible to present an optimum cell placement result without requiring any additional time and complete the wiring processing without any surplus time.

It is to be appreciated that the present invention involves any appropriate variants without impairing the objects and advantages thereof. The present invention is not limited by the numerical values indicated in the above embodiments.

What is claimed is:

1. A cell placement apparatus for use in computer aided design automation, comprising:
   a restricted region specifying module specifying both a restricted region in which is restricted a cell activity ratio indicative of a ratio of a cell occupied area to a chip surface area and a cell maximum activity ratio of said restricted region;
   a restricted region managing module accepting for management said restricted region and said cell maximum activity ratio specified by said restricted region specifying module; and
   a cell placing module placing cells in such a manner that said cell activity ratio of said restricted region managed by said restricted region managing module does not exceed said cell maximum activity ratio, wherein
   let s1 and s2 be cell areas in a first region and a second region, respectively, which are obtained as a result of bisecting, s (=s1+s2) be a total cell area, S1 and S2 be areas of said first region and said second region, respectively, S1(i) be an area of a portion belonging to said first region within an i-th restricted region, S2(i) be an area of a portion belonging to said second region within said i-th restricted region, and ρ(i) be a cell activity ratio specified for said i-th restricted region, then
   said cell placement control module figures out areas S1(0) and S2(0) of portions having no cell activity ratio restriction in said first region and said second region, respectively, from $$S1(0)=S1-\Sigma S1(i)$$
   $$S2(0)=S2-\Sigma S2(i)$$

and wherein
   said cell placement control module then figures out an activity ratio ρ(0) of a portion having no cell activity ratio restriction, from $$\rho(0)=\{(\text{total cell area})-(\text{total cell area of activity ratio specified regions})\}/(\text{total area})=[s-\Sigma\{\rho(i)\times(S1(i)+S2(i))\}]/S1(0)+S2(0)$$

and wherein
   said cell placement control module then figures out cell effective areas s1' and s2' in said first and second regions, respectively, based on said activity ratios ρ(0) and ρ(i), from $$s1'=\rho(0)\times S1(0)+\Sigma(\rho(i)\times S1(i))$$
   $$s2'=\rho(0)\times S2(0)+\Sigma(\rho(i)\times S1(i))$$

and wherein
   said cell placement control module then figures out converted areas S1' and S2' by proportionally dividing a total area of said first and second regions by ratios, to a total cell area s, of cell effective areas s1' and s2' in said first and second regions, respectively, using $$S1'=(S1+S2)\times(s1'/s)$$
   $$S2'=(S1+S2)\times(s2'/s)$$

and wherein
   said cell placement control module then provides a control of grouping of cells effected by said partitioning based placing module so that an absolute value of a difference between ratios of cell areas s1 and s2 to said converted areas S1' and S2', respectively, of said first and second regions, respectively, satisfies a condition $$|s1/S1'-s2/S2'|\leq\alpha.$$

2. The cell placement apparatus according to claim 1, wherein
   said restricted region specifying module specifies said restricted region and said cell maximum activity ratio on the basis of an operative input of a user.

3. The cell placement apparatus according to claim 1, wherein
   said restricted region specifying module specifies as said cell maximum activity ratio of said restricted region a lower activity ratio than a cell activity ratio of said chip in its entirety.

4. The cell placement apparatus according to claim 1, wherein
   said restricted region specifying module specifies a 50% of activity ratio as said cell maximum activity ratio of said restricted region, with respect to 60 to 70% of ordinary cell activity ratios.

5. The cell placement apparatus according to claim 1, wherein
   said restricted region specifying module estimates a wiring density of portions obtained from on-chip block partitioning based on locations of already placed cells of which placement locations are fixedly determined and determines from said wiring density a restricted region in which a cell activity ratio is restricted and a cell maximum activity ratio of said restricted region.

6. The cell placement apparatus according to claim 5, wherein
   said restricted region specifying module includes:
   an already placed cell placing module placing already placed cells of which placement locations are fixedly determined on said chip;

a rough wiring module executing a rough wiring for said already placed cells;

a high-density wiring region judging module which partitions said chip into blocks each having a predetermined size and detects a wiring density based on said rough wiring for each block, to judge whether a region is a high-density wiring region or not; and a restricted region deciding module deciding said high-density wiring region as a restricted region in which a cell activity ratio is restricted and allocating as a cell maximum activity ratio to said restricted region a lower activity ratio than an ordinary cell activity ratio.

7. The cell placement apparatus according to claim 6, wherein said restricted region deciding module decides as said cell maximum activity ratio of said restricted region a lower activity ratio than a cell activity ratio of said chip in its entirety.

8. The cell placement apparatus according to claim 6, wherein said restricted region deciding module has activity ratio information in which is previously registered a cell maximum activity ratio of said restricted region and refers to said activity ratio information to determine said cell maximum activity ratio of said restricted region.

9. The cell placement apparatus according to claim 1, wherein said restricted region specifying module estimates a wiring density of portions obtained from on-chip block partitioning based on locations of globally placed cells and determines from said wiring density a restricted region in which a cell activity ratio is restricted and a cell maximum activity ratio of said restricted region.

10. The cell placement apparatus according to claim 9, wherein said restricted region specifying module includes:

a cell global placing module globally placing cells on said chip;

a rough wiring module performing a rough wiring for said globally placed cells;

a high-density wiring region judging module partitioning said chip into blocks, each block having a predetermined size, and detecting a wiring density based on said rough wiring for each block, to judge whether it is a high-density wiring region or not; and a restricted region deciding module deciding said high-density wiring region as a restricted region in which a cell activity ratio is restricted and allocating to said restricted region as said cell maximum activity ratio a lower activity ratio than an ordinary cell activity ratio.

11. A cell placement method for use in computer aided design automation, comprising:

specifying a restricted region in which is restricted a cell activity ratio indicative of a ratio of a cell occupied area to the entire surface area of a chip and a cell maximum activity ratio of said restricted region;

accepting management of said restricted region and said cell maximum activity ratio specified by said specifying of said restricted region; and placing cells in such a manner that said cell activity ratio of said restricted region managed in said accepting management of said restricted region does not exceed said cell maximum activity ratio, wherein let s1 and s2 be cell areas in a first region and a second region, respectively, which are obtained as a result of bisecting, s ($=s1+s2$) be a total cell area, S1 and S2 be areas of said first region and said second region, respectively, S1(i) be an area of a portion belonging to said first region within an i-th restricted region, S2(i) be an area of a portion belonging to said second region within said i-th restricted region, and $\rho(i)$ be a cell activity ratio specified for said i-th restricted region, then said cell placement control module figures out areas S1(0) and S2(0) of portions having no cell activity ratio restriction in said first region and said second region, respectively, from $$S1(0)=S1-\Sigma S1(i)$$

$$S2(0)=S2-\Sigma S2(i)$$

and wherein said cell placement control module then figures out an activity ratio $\rho(0)$ of a portion having no cell activity ratio restriction, from $$\rho(0)=\{(\text{total cell area})-(\text{total cell area of activity ratio specified regions}))/(\text{total area})=[s-\Sigma\{\rho(i)\times(S1(i)+S2(i))\}]/S1(0)+S2(0)$$

and wherein said cell placement control module then figures out cell effective areas s1' and s2' in said first and second regions, respectively, based on said activity ratios $\rho(0)$ and $\rho(i)$, from $$s1'=\rho(0)\times S1(0)+\Sigma(\rho(i)\times S1(i))$$

$$s2'=\rho(0)\times S2(0)+\Sigma(\rho(i)\times S1(i))$$

and wherein said cell placement control module then figures out converted areas S1' and S2' by proportionally dividing a total area of said first and second regions by ratios, to a total cell area s, of cell effective areas s1' and s2' in said first and second regions, respectively, using $$S1'=(S1+S2)\times(s1'/s)$$

$$S2'=(S1+S2)\times(s2'/s)$$

and wherein said cell placement control module then provides a control of grouping of cells effected by said partitioning based placing module so that an absolute value of a difference between ratios of cell areas s1 and s2 to said converted areas S1' and S2', respectively, of said first and second regions, respectively, satisfies a condition $$|s1/S1'-s2/S2'|\leq\alpha.$$

12. The cell placement method according to claim 11, wherein said specifying of said restricted region includes specifying said restricted region and said cell maximum activity ratio through an operative input of a user.

13. The cell placement method according to claim 11, wherein said specifying of said restricted region includes specifying as said cell maximum activity ratio of said restricted region a lower activity ratio than a cell activity ratio of said chip in its entirety.

14. The cell placement method according to claim 11, wherein
said specifying of said restricted region includes specifying a 50% of activity ratio as said cell maximum activity ratio of said restricted region, with respect to 60 to 70% of ordinary cell activity ratios.

15. The cell placement method according to claim 11, wherein
said specifying of said restricted region includes estimating a wiring density for each step obtained from on-chip block partitioning based on locations of already placed cells of which placement locations are fixedly determined, and determining from said wiring density a restricted region in which a cell activity ratio is restricted and a cell maximum activity ratio of said restricted region.

16. The cell placement method according to claim 15, wherein
said specifying of said restricted region includes:
placing already placed cells of which placement locations are fixedly determined on said chip;
performing a rough wiring for said already placed cells;
partitioning said chip into blocks, each block having a predetermined size, and detecting a wiring density based on said rough wiring for each block, to judge whether a region is a high-density wiring region or not; and
deciding said high-density wiring region as a restricted region in which a cell activity ratio is restricted and allocating as a cell maximum activity ratio to said restricted region a lower activity ratio than an ordinary cell activity ratio.

17. The cell placement method according to claim 16, wherein
said deciding of said high-density wiring region includes deciding as said cell maximum activity ratio of said restricted region a lower activity ratio than a cell activity ratio of said chip in its entirety.

18. The cell placement method according to claim 16, wherein
said deciding of said high-density wiring region includes having activity ratio information in which is previously registered a cell maximum activity ratio of said restricted region and referring to said activity ratio information to determine said cell maximum activity ratio of said restricted region.

19. The cell placement method according to claim 11, wherein
said specifying of said restricted region includes estimating a wiring density for each on-chip block partitioning based on locations of globally placed cells and determining from said wiring density a restricted region in which a cell activity ratio is restricted and a cell maximum activity ratio of said restricted region.

20. The cell placement method according to claim 19, wherein
said specifying of said restricted region includes:
globally placing cells on said chip;
performing a rough wiring for said globally placed cells;
partitioning said chip into blocks, each block having a predetermined size, and detecting a wiring density based on said rough wiring for each block, to judge whether a region is a high-density wiring region or not; and
deciding said high-density wiring region as a restricted region in which a cell activity ratio is restricted and for allocating as a cell maximum activity ratio to said restricted region a lower activity ratio than an ordinary cell activity ratio.

21. A computer readable record medium, comprising:
a restricted region specifying module specifying both a restricted region in which is restricted a cell activity ratio indicative of a ratio of a cell occupied area to a chip surface area and a cell maximum activity ratio of said restricted region;
a restricted region managing module accepting for management said restricted region and said cell maximum activity ratio specified by said restricted region specifying module; and
a cell placing module placing cells in such a manner that said cell activity ratio of said restricted region managed by said restricted region managing module does not exceed said cell maximum activity ratio, wherein
let s1 and s2 be cell areas in a first region and a second region, respectively, which are obtained as a result of bisecting, s (=s1+s2) be a total cell area, S1 and S2 be areas of said first region and said second region, respectively, S1(i) be an area of a portion belonging to said first region within an i-th restricted region, S2(i) be an area of a portion belonging to said second region within said i-th restricted region, and $\rho(i)$ be a cell activity ratio specified for said i-th restricted region, then
said cell placement control module figures out areas $S1(0)$ and $S2(0)$ of portions having no cell activity ratio restriction in said first region and said second region, respectively, from $$S1(0)=S1-\Sigma S1(i)$$

$$S2(0)=S2-\Sigma S2(i)$$

and wherein
said cell placement control module then figures out an activity ratio $\rho(0)$ of a portion having no cell activity ratio restriction, from $$\rho(0)=\{(\text{total cell area})-(\text{total cell area of activity ratio specified regions})\}/(\text{total area})=[s-\Sigma\{\rho(i)\times(S1(i)+S2(i))\}]/S1(0)+S2(0)$$

and wherein
said cell placement control module then figures out cell effective areas s1' and s2' in said first and second regions, respectively, based on said activity ratios $\rho(0)$ and $\rho(i)$, from $$s1'=\rho(0)\times S1(0)+\Sigma(\rho(i)\times S1(i))$$

$$s2'=\rho(0)\times S2(0)+\Sigma(\rho(i)\times S1(i))$$

and wherein
said cell placement control module then figures out converted areas S1' and S2' by proportionally dividing a total area of said first and second regions by ratios, to a total cell area s, of cell effective areas s1' and s2' in said first and second regions, respectively, using $$S1'=(S1+S2)\times(s1'/s)$$

$$S2'=(S1+S2)\times(s2'/s)$$

and wherein
said cell placement control module then provides a control of grouping of cells effected by said partitioning based placing module so that an absolute value of a difference between ratios of cell areas s1 and s2 to said converted areas S1' and S2', respectively, of said first and second regions, respectively, satisfies a condition $$|s1/S1'-s2/S2'|\leq\alpha.$$

22. The record medium according to claim 21, wherein said restricted region specifying module specifies said restricted region and said cell maximum activity ratio on the basis of an operative input of a user.

23. The record medium according to claim 21, wherein said restricted region specifying module includes:

an already placed cell placing module placing already placed cells of which placement locations are fixedly determined on said chip;

a rough wiring module executing a rough wiring for said already placed cells;

a high-density wiring region judging module partitioning said chip into blocks each having a predetermined size and detects a wiring density based on said rough wiring for each block, to judge whether a region is a high-density wiring region or not; and a restricted region deciding module deciding said high-density wiring region as a restricted region in which a cell activity ratio is restricted and allocates as a cell maximum activity ratio to said restricted region a lower activity ratio than an ordinary cell activity ratio.

24. The record medium according to claim 21, wherein said restricted region specifying module includes:

a cell global placing module globally placing cells on said chip;

a rough wiring module for performing a rough wiring for said globally placed cells;

a high-density wiring region judging module partitioning said chip into blocks each having a predetermined size and detecting a wiring density based on said rough wiring for each block, to judge whether it is a high-density wiring region or not; and a restricted region deciding module deciding said high-density wiring region as a restricted region in which a cell activity ratio is restricted and allocating to said restricted region as said cell maximum activity ratio a lower activity ratio than an ordinary cell activity ratio.

* * * * *